(12) United States Patent
Kurashima

(10) Patent No.: US 10,962,301 B2
(45) Date of Patent: Mar. 30, 2021

(54) LOOP HEAT PIPE

(71) Applicant: SHINKO ELECTRIC INDUSTRIES CO., LTD., Nagano (JP)

(72) Inventor: Nobuyuki Kurashima, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 26 days.

(21) Appl. No.: 16/515,234

(22) Filed: Jul. 18, 2019

(65) Prior Publication Data
US 2020/0025463 A1 Jan. 23, 2020

(30) Foreign Application Priority Data

Jul. 23, 2018 (JP) .............................. JP2018-137599
Jul. 16, 2019 (JP) .............................. JP2019-131011

(51) Int. Cl.
*F28D 15/00* (2006.01)
*F28D 15/04* (2006.01)

(52) U.S. Cl.
CPC ......... *F28D 15/043* (2013.01); *F28D 15/046* (2013.01)

(58) Field of Classification Search
CPC ... F28D 15/043; F28D 15/0266; F28D 15/046
USPC ....................................................... 165/80.4
See application file for complete search history.

(56) References Cited

U.S. PATENT DOCUMENTS

| | | | | |
|---|---|---|---|---|
| 4,550,774 A * | 11/1985 | Andres | ............... | F28D 15/0233 165/104.14 |
| 5,761,037 A * | 6/1998 | Anderson | ........... | F28D 15/0266 165/104.26 |
| 5,774,334 A * | 6/1998 | Kawamura | ......... | H01L 23/4338 165/80.4 |
| 5,937,936 A * | 8/1999 | Furukawa | ........... | F28D 15/0233 165/104.33 |
| 6,097,597 A * | 8/2000 | Kobayashi | .......... | F28D 15/0233 165/104.14 |
| 6,397,935 B1 * | 6/2002 | Yamamoto | .......... | F28D 15/0233 165/104.21 |
| 6,729,383 B1 * | 5/2004 | Cannell | ................... | F28F 3/022 165/185 |
| 6,981,543 B2 * | 1/2006 | Chesser | ................ | F28D 15/043 165/104.13 |
| 7,000,684 B2 * | 2/2006 | Kenny | .................... | F04B 17/00 165/104.21 |
| 7,080,680 B2 * | 7/2006 | Ota | ..................... | F28D 15/0233 165/104.33 |
| 7,188,662 B2 * | 3/2007 | Brewer | ................ | H01L 23/473 165/80.4 |

(Continued)

FOREIGN PATENT DOCUMENTS

JP 6146484 6/2017

*Primary Examiner* — Claire E Rojohn, III
(74) *Attorney, Agent, or Firm* — IPUSA, PLLC

(57) ABSTRACT

A loop heat pipe includes a first flow path, a second flow path over the first flow path, and a divider provided between the first flow path and the second flow path. Each of the first flow path and the second flow path includes an evaporator configured to vaporize a working fluid, a condenser configured to condense the working fluid, a first transport pipe connecting the evaporator and the condenser, and a second transport pipe connecting the evaporator and the condenser and forming a loop flow path with the transport pipe.

11 Claims, 23 Drawing Sheets

(56) References Cited

U.S. PATENT DOCUMENTS

| | | | | |
|---|---|---|---|---|
| 7,578,337 | B2* | 8/2009 | Spokoiny | H05K 7/20254 |
| | | | | 165/109.1 |
| 7,992,625 | B1* | 8/2011 | Spokoiny | F28F 3/12 |
| | | | | 165/80.4 |
| 8,479,805 | B2* | 7/2013 | Chang | F28F 3/12 |
| | | | | 165/80.3 |
| 8,919,426 | B2* | 12/2014 | Hardesty | F28D 15/0233 |
| | | | | 165/104.21 |
| 8,929,073 | B2* | 1/2015 | Suzuki | F28D 15/046 |
| | | | | 361/700 |
| 9,464,849 | B2* | 10/2016 | Uchida | F28D 15/0266 |
| 10,177,075 | B2* | 1/2019 | Bezama | F28D 15/00 |
| 10,619,941 | B2* | 4/2020 | Huang | F28F 3/12 |
| 2003/0024691 | A1* | 2/2003 | Tsay | F28D 15/0233 |
| | | | | 165/104.26 |
| 2007/0240857 | A1* | 10/2007 | Hou | F28D 15/046 |
| | | | | 165/104.26 |
| 2010/0326632 | A1* | 12/2010 | Nagai | F28F 3/086 |
| | | | | 165/104.26 |
| 2016/0259383 | A1* | 9/2016 | Shioga | G06F 1/203 |
| 2019/0293362 | A1* | 9/2019 | Machida | F28D 15/0266 |
| 2019/0335619 | A1* | 10/2019 | Tseng | H01L 23/427 |
| 2020/0018556 | A1* | 1/2020 | Machida | F28D 15/0283 |
| 2020/0049417 | A1* | 2/2020 | Machida | F28D 15/0233 |
| 2020/0049419 | A1* | 2/2020 | Machida | H05K 7/20336 |
| 2020/0064077 | A1* | 2/2020 | Machida | F28D 15/0233 |
| 2020/0096261 | A1* | 3/2020 | Tanaka | F28D 15/043 |
| 2020/0124353 | A1* | 4/2020 | Machida | F28D 15/043 |

\* cited by examiner

LOOP HEAT PIPE

CROSS-REFERENCE TO RELATED APPLICATION

This application is based upon and claims the benefit of priority of the prior Japanese Patent Application Nos. 2018-137599, filed on Jul. 23, 2018, and 2019-131011, filed on Jul. 16, 2019, the entire contents of which are incorporated herein by reference.

FIELD

A certain aspect of the embodiments discussed herein is related to loop heat pipes.

BACKGROUND

Heat pipes are known as devices to cool heat generating components installed in electronic devices, such as a central processing unit (CPU). Heat pipes are devices that transport heat using the phase transition of a working fluid.

Examples of heat pipes include a loop heat pipe that includes an evaporator configured to vaporize a working fluid with the heat of a heat generating component and a condenser configured to cool and condense the vaporized working fluid, where the evaporator and the condenser are connected by a liquid pipe and a vapor pipe that form a loop flow path. In the loop heat pipe, the working fluid flows unidirectionally in the loop flow path.

Furthermore, a porous body is provided in the liquid pipe of the loop heat pipe. The working fluid in the liquid pipe is guided to the evaporator by a capillary force generated in the porous body to prevent vapor from reversely flowing from the evaporator into the liquid pipe. Numerous pores are formed in the porous body. Each pore is formed by stacking metal layers in which through holes are formed such that the through holes overlap each other. (See, for example, Japanese Patent No. 6146484.)

SUMMARY

According to an aspect of the present invention, a loop heat pipe includes a first flow path, a second flow path over the first flow path, and a divider provided between the first flow path and the second flow path. Each of the first flow path and the second flow path includes an evaporator configured to vaporize a working fluid, a condenser configured to condense the working fluid, a first transport pipe connecting the evaporator and the condenser, and a second transport pipe connecting the evaporator and the condenser and forming a loop flow path with the transport pipe.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
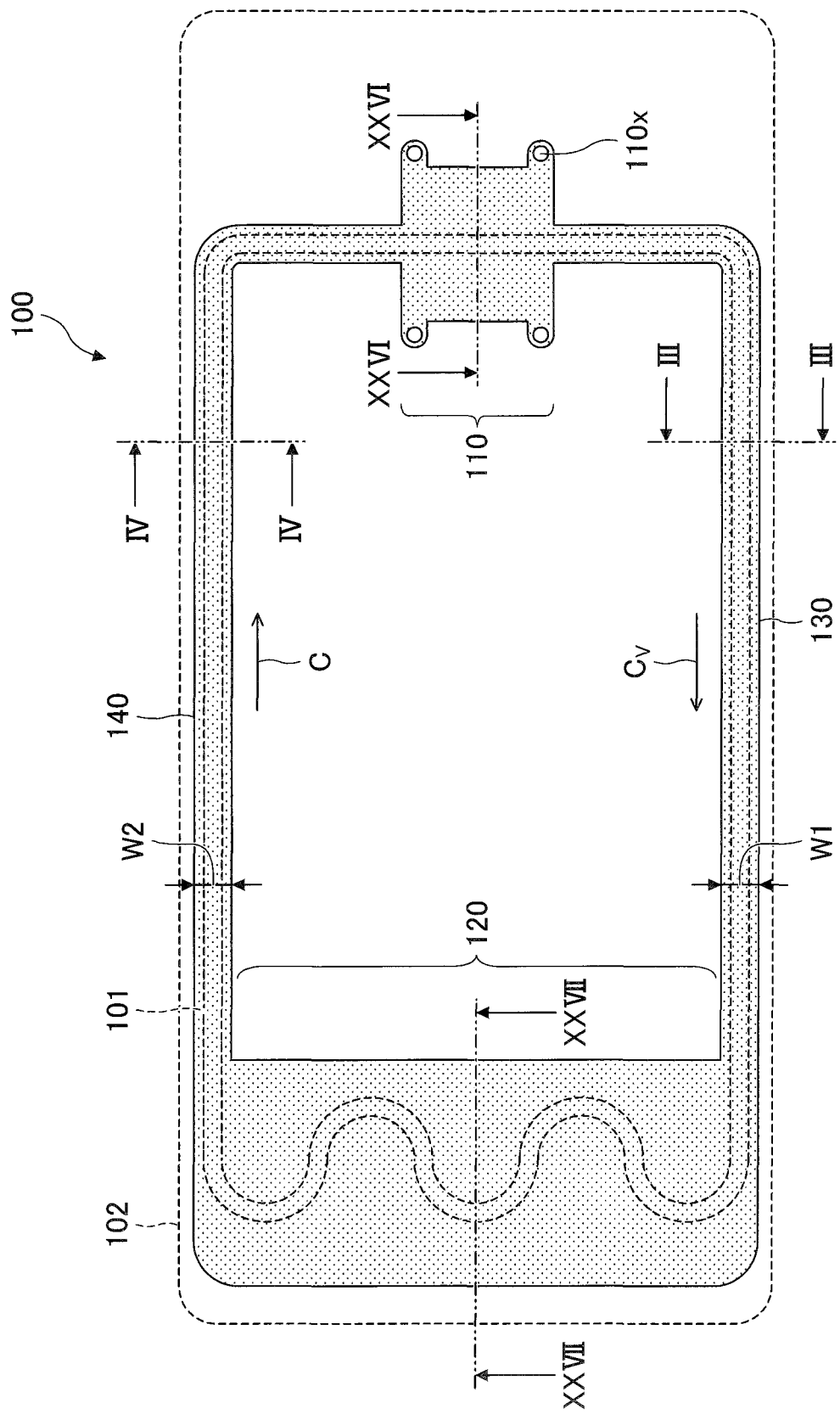
FIG. 1 is a schematic plan view of a loop heat pipe according to a first embodiment.

According to conventional loop heat pipes, the heat transport performance may decrease as the ambient temperature increases.

The inventor of the present invention has diligently worked to identify the cause of a decrease in the heat transport performance with an increase in the ambient temperature. The detailed analysis by the inventor has revealed that as a working fluid in the liquid pipe tends to vaporize with an increase in the ambient temperature, the fluidity of the working fluid decreases to degrade the heat transport performance.

For example, the boiling point of water is approximately 40° C. at a pressure of 60 hPa. Therefore, when water is used as a working fluid and the internal pressure of the loop heat pipe is reduced to 60 hPa, the evaporator starts to operate at a temperature of approximately 40° C. When the ambient temperature increases, for example, becomes 50° C. or higher, however, the liquid-phase working fluid in the liquid pipe also tends to vaporize, so that the fluidity of the working fluid decreases to degrade the heat transport performance. The vaporization of the working fluid in the liquid pipe can be controlled by increasing the internal pressure of the loop heat pipe. This, however, causes the evaporator to start to operate at a higher temperature.

Preferred embodiments of the present invention will be explained with reference to the accompanying drawings. In the following, elements having substantially the same functional configuration are referred to using the same reference numeral, and duplicate description thereof may be omitted.

[a] First Embodiment

A description is given of a first embodiment, which relates to a loop heat pipe.

FIG. 1 is a schematic plan view of a loop heat pipe 100 according to the first embodiment.

Referring to FIG. 1, the loop heat pipe 100 includes an evaporator 110, a condenser 120, a vapor pipe 130, and a liquid pipe 140. The loop heat pipe 100 may be accommodated in, for example, a mobile electronic device 102 such as a smartphone or a tablet terminal.

According to the loop heat pipe 100, the evaporator 110 is configured to vaporize a working fluid C to generate vapor Cv. The condenser 120 is configured to condense the vapor Cv of the working fluid C. The evaporator 110 and the condenser 120 are connected by the vapor pipe 130 and the liquid pipe 140. The vapor pipe 130 and the liquid pipe 140 form a loop flow path 101 in which the working fluid C or the vapor Cv flows. The vapor pipe 130 is an example of a first transport pipe and a third transport pipe. The liquid pipe 140 is an example of a second transport pipe and a fourth transport pipe.

Figure 2:
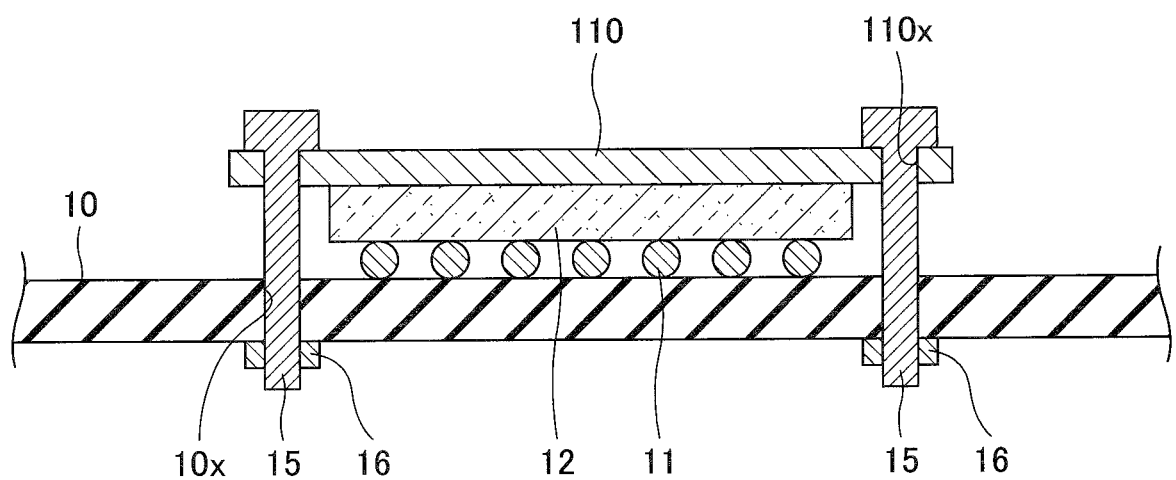
FIG. 2 is a cross-sectional view of an evaporator and its vicinity of the loop heat pipe according to the first embodiment.

FIG. 2 is a cross-sectional view of the evaporator 110 and its vicinity of the loop heat pipe 100 according to the first embodiment. Referring to FIGS. 1 and 2, for example, four through holes 110x are formed in the evaporator 110. The evaporator 110 is fixed to a circuit board 10 by inserting bolts 15 into the through holes 110x formed in the evaporator 110 and through holes 10x formed in the circuit board 10 and tightening the bolts 15 with nuts 16 on the lower surface of the circuit board 10.

For example, a heat generating component 12 such as a CPU is mounted on the circuit board 10 through bumps 11. The upper surface of the heat generating component 12 adheres to the lower surface of the evaporator 110. The working fluid C in the evaporator 110 vaporizes because of heat generated in the heat generating component 12, so that the vapor Cv is generated.

Referring to FIG. 1, the vapor Cv generated in the evaporator 110 is guided to the condenser 120 through the vapor pipe 130 to condense in the condenser 120. As a result, heat generated in the heat generating component 12 migrates to the condenser 120, so that an increase in the temperature of the heat generating component 12 is controlled. The working fluid C condensed in the condenser 120 is guided to the evaporator 110 through the liquid pipe 140. A width W1 of the vapor pipe 130 may be, for example, approximately 8 mm. A width W2 of the liquid pipe 140 may be, for example, approximately 6 mm. The width W1 of the vapor pipe 130 and the width W2 of the liquid pipe 140 are not limited to these, and may be equal, for example.

The working fluid C is not limited to a particular kind, but is preferably a fluid of a high vapor pressure and a high latent heat of vaporization to efficiently cool the heat generating component 12 with latent heat of vaporization. Examples of such a fluid include ammonia, water, chlorofluorocarbon, alcohol, and acetone.

Figure 3:
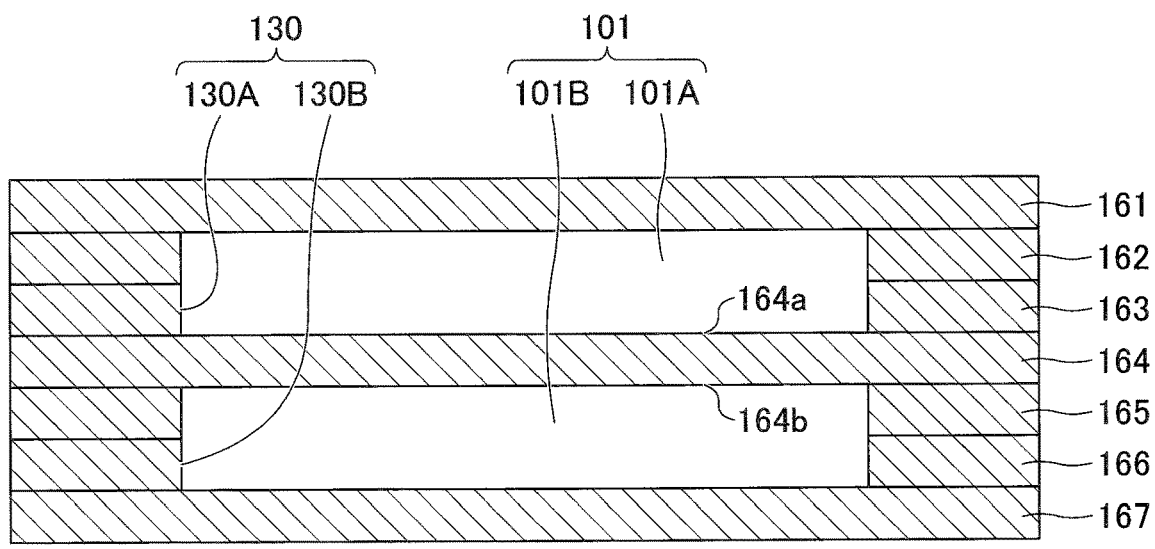
FIG. 3 is a cross-sectional view illustrating a configuration of a vapor pipe of the loop heat pipe according to the first embodiment.
Figure 4:
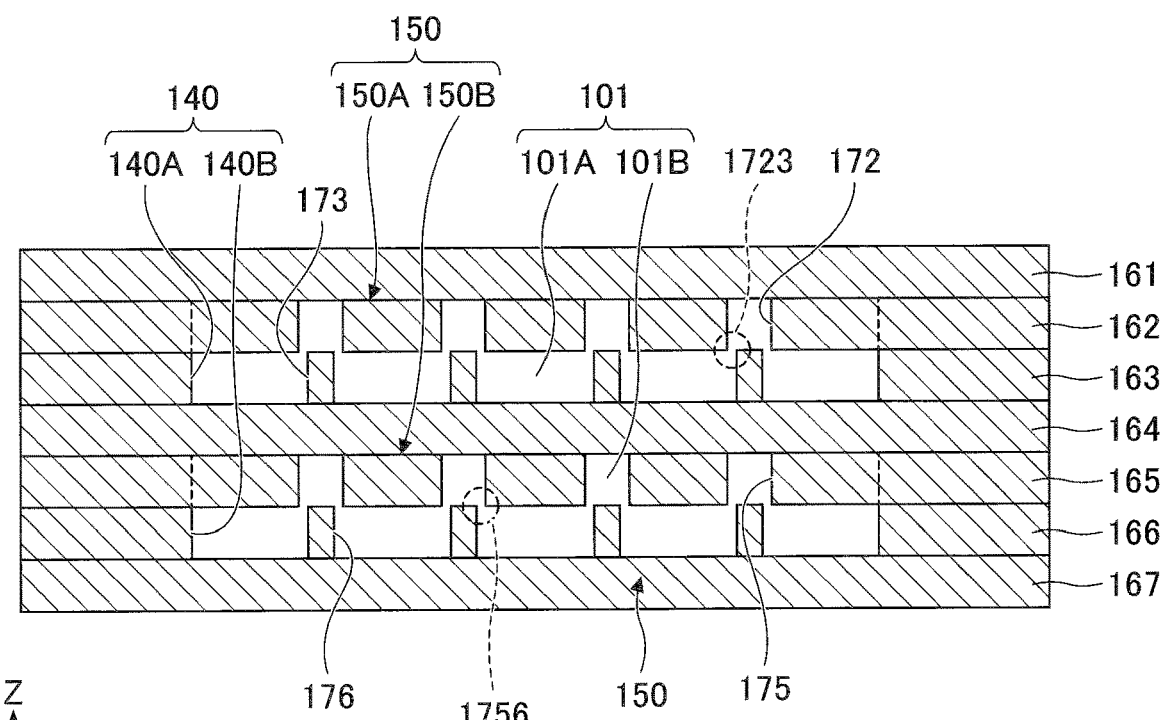
FIG. 4 is a cross-sectional view illustrating a configuration of a liquid pipe of the loop heat pipe according to the first embodiment.

The evaporator 110, the condenser 120, the vapor pipe 130, and the liquid pipe 140 may have a laminated structure of multiple metal layers, for example (see FIGS. 3 and 4). The metal layers are, for example, copper layers, which have good thermal conductivity, and are directly joined together by, for example, solid-state welding. The thickness of each metal layer may be, for example, approximately 50 μm to approximately 200 μm.

The metal layers are not limited to copper layers, and may be, for example, stainless steel layers, aluminum layers, or magnesium alloy layers.

Next, a configuration of the vapor pipe 130 and a configuration of the liquid pipe 140 are described. FIG. 3 is a cross-sectional view taken along the line in FIG. 1, illustrating a configuration of the vapor pipe 130. FIG. 4 is a cross-sectional view taken along the line IV-IV in FIG. 1, illustrating a configuration of the liquid pipe 140.

The vapor pipe 130 and the liquid pipe 140 may have a laminated structure of, for example, seven metal layers 161 through 167. The metal layers 161 through 167 are, for example, copper layers, which have good thermal conductivity, and are directly joined together by, for example, solid-state welding. The thickness of each of the metal layers 161 through 167 may be, for example, approximately 50 μm to approximately 200 μm. The metal layers 161 through 164 form a first flow path 101A, and the metal layers 164 through 167 form a second flow path 101B. A porous body 150 is provided in the liquid pipe 140. The metal layers 161 through 167 are not limited to copper layers, and may be, for example, stainless steel layers, aluminum layers, or magnesium alloy layers.

Figure 5:
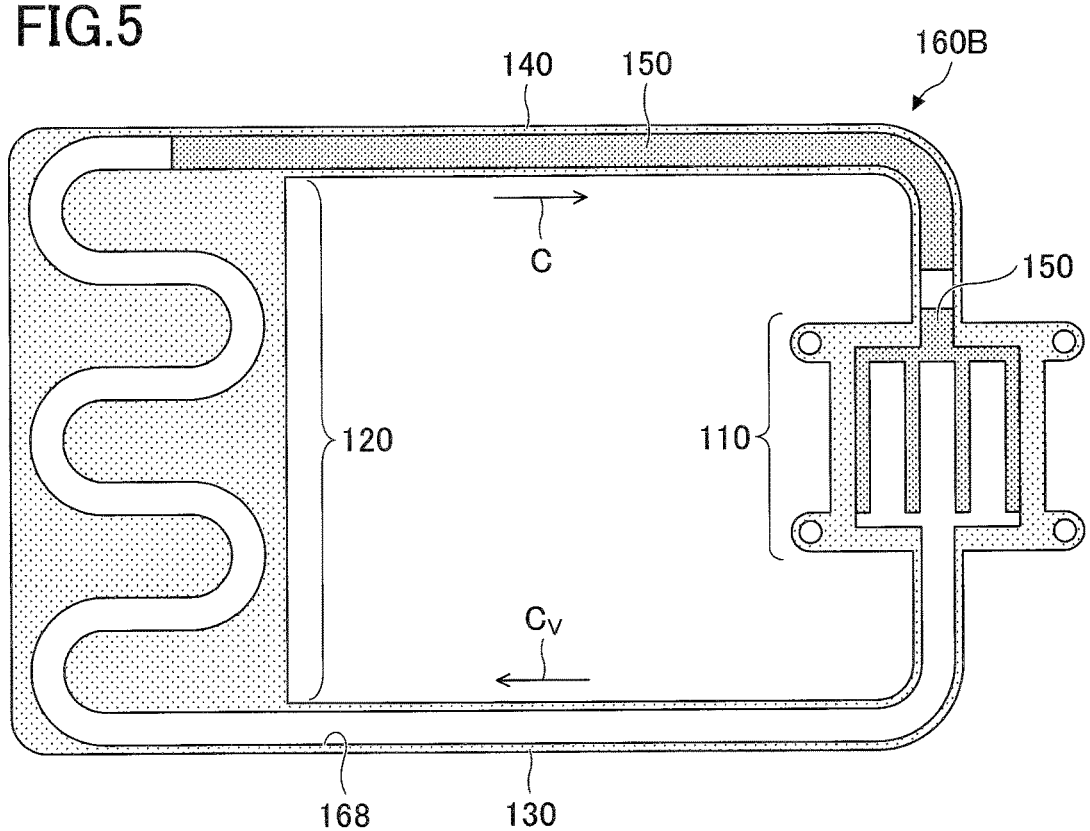
FIG. 5 is a plan view illustrating a configuration of a metal layer of the loop heat pipe according to the first embodiment.
Figure 6:
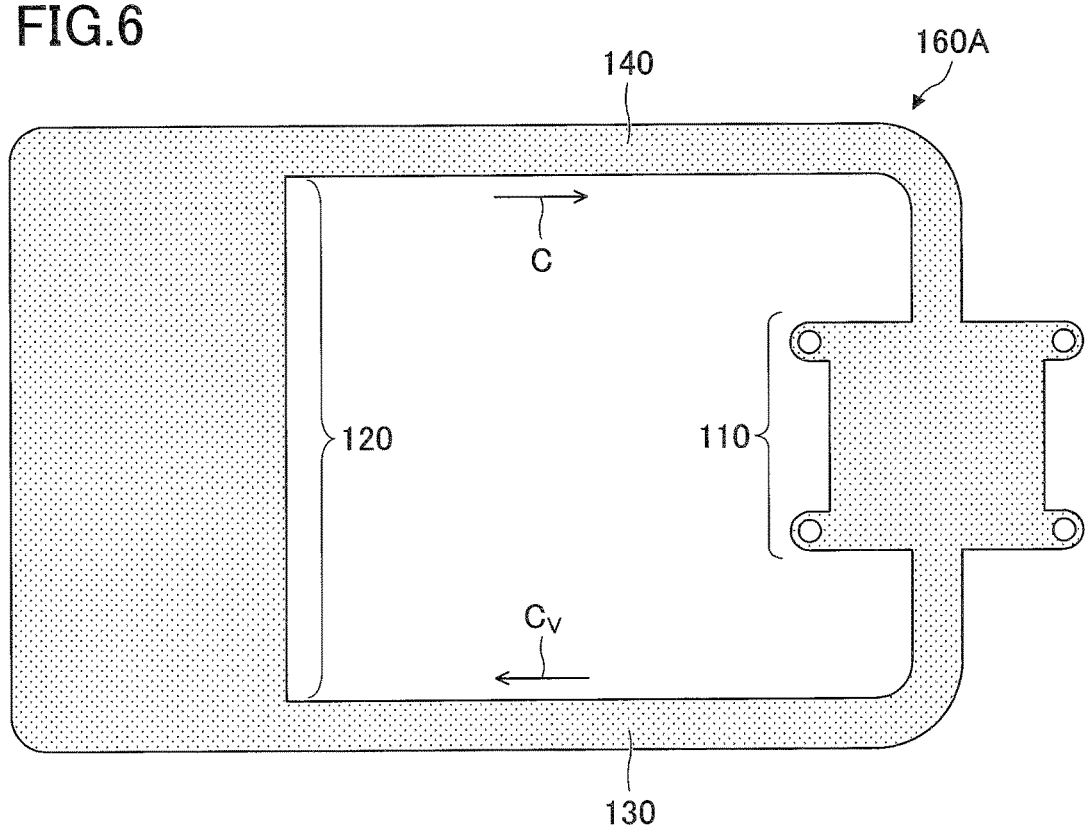
FIG. 6 is a plan view illustrating a configuration of a metal layer of the loop heat pipe according to the first embodiment.

Next, a configuration of the metal layers 161 through 167 is described. FIG. 5 is a plan view illustrating a configuration of the metal layers 162, 163, 165 and 166. FIG. 6 is a plan view illustrating a configuration of the metal layers 161, 164 and 167. Hereinafter, the metal layer 161 of the first layer (one of the outermost layers), the metal layer 164 of the fourth (central) layer, and the metal layer 167 of the seventh layer (the other of the outermost layers) may be collectively referred to as "metal layer 160A." Furthermore, the other metal layers 162, 163, 165 and 166 may be collectively referred to as "metal layer 160B."

Referring to FIG. 5, an opening 168 extending along the movement direction of the working fluid C is formed in the metal layer 160B. Furthermore, the porous body 150 is provided in the opening 168 in the liquid pipe 140. The porous body 150 extends from the condenser 120 to the evaporator 110 along the liquid pipe 140. The porous body 150 is also provided in the evaporator 110. The porous body 150 includes through holes formed in the metal layer 160B. The porous body 150 is described in detail below.

Referring to FIG. 6, the outline of the metal layer 160A coincides with the outline of the metal layer 160B in a plan view. The metal layer 160A, however, is a solid metal layer in which the opening 168 is not formed.

Figure 7B:
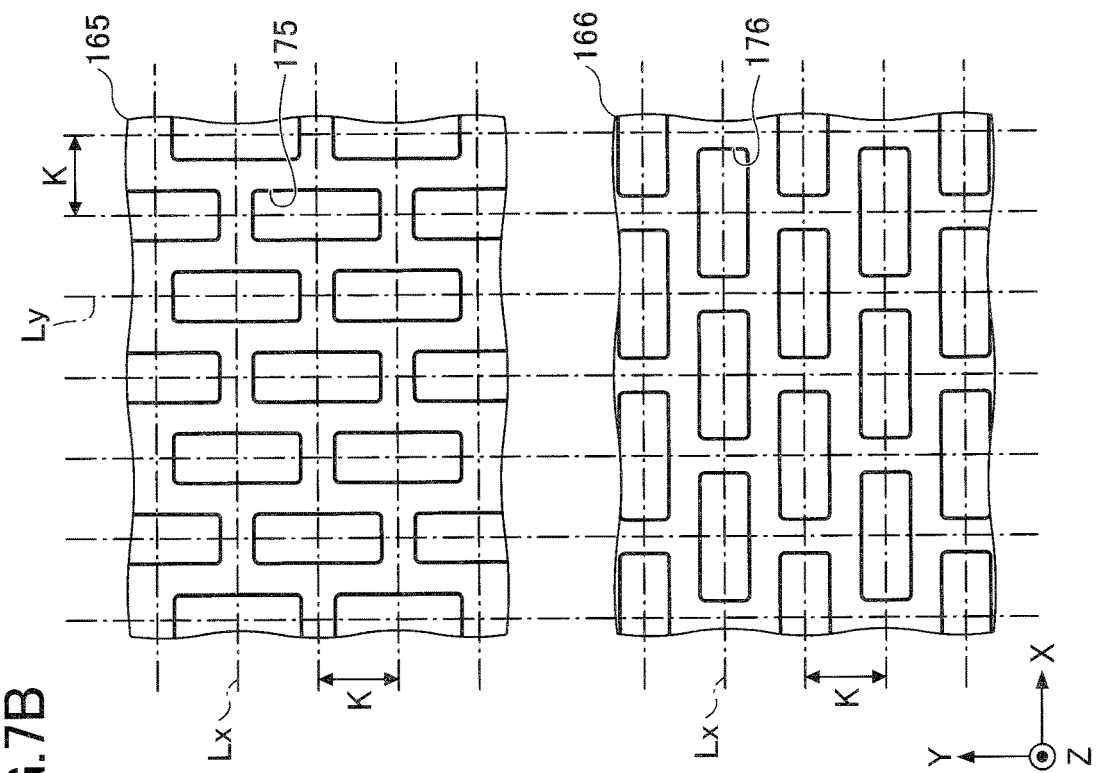
FIGS. 7A and 7B are plan views illustrating arrangements of through holes.
Figure 7A:
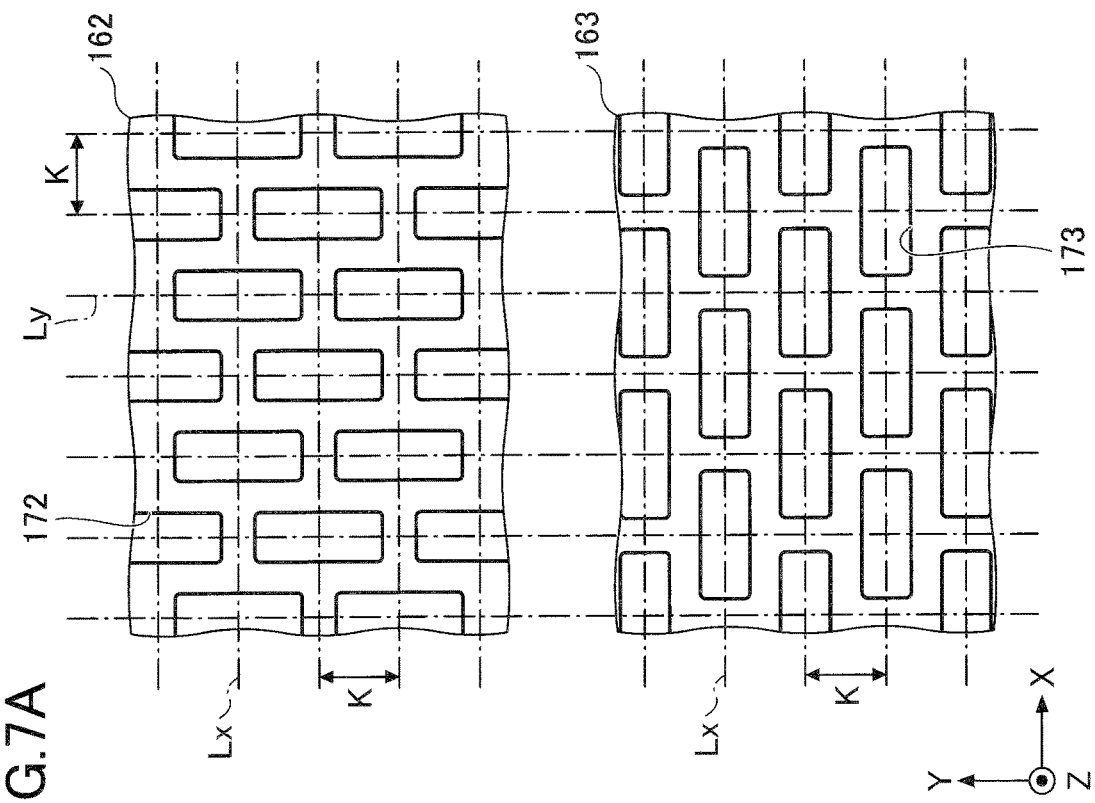
Figure 8A:
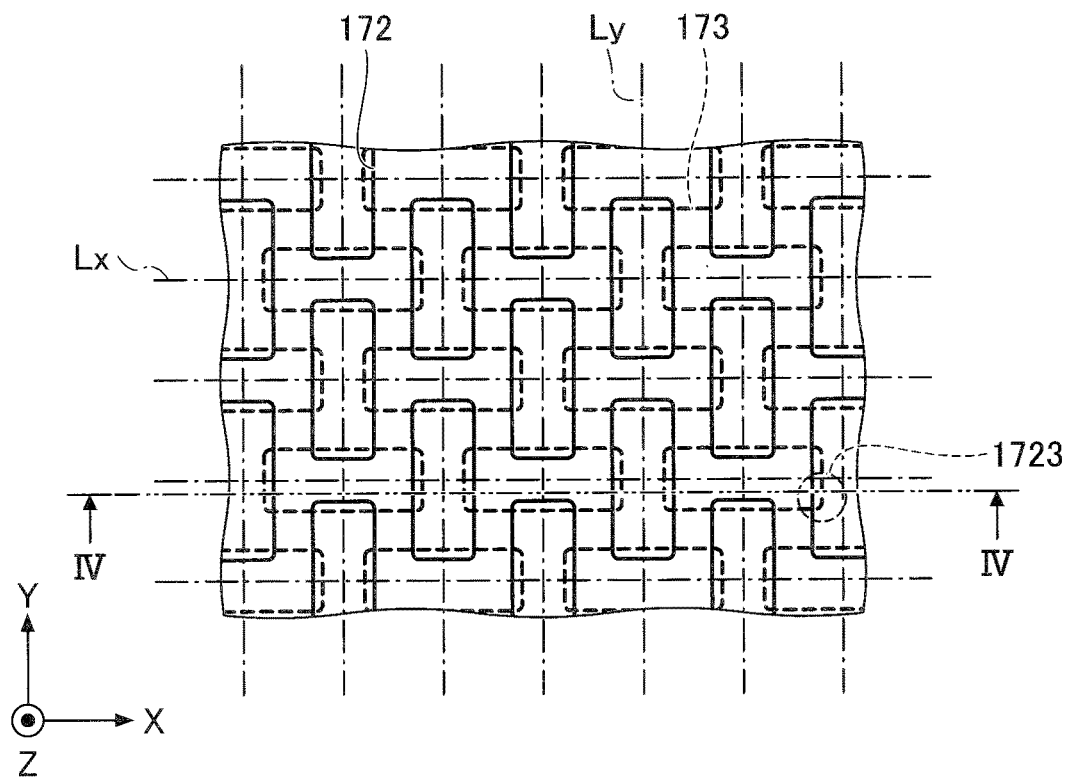
FIGS. 8A and 8B are plan views each illustrating the positions of through holes in the case of stacking two metal layers in FIG. 7A or 7B.
Figure 8B:
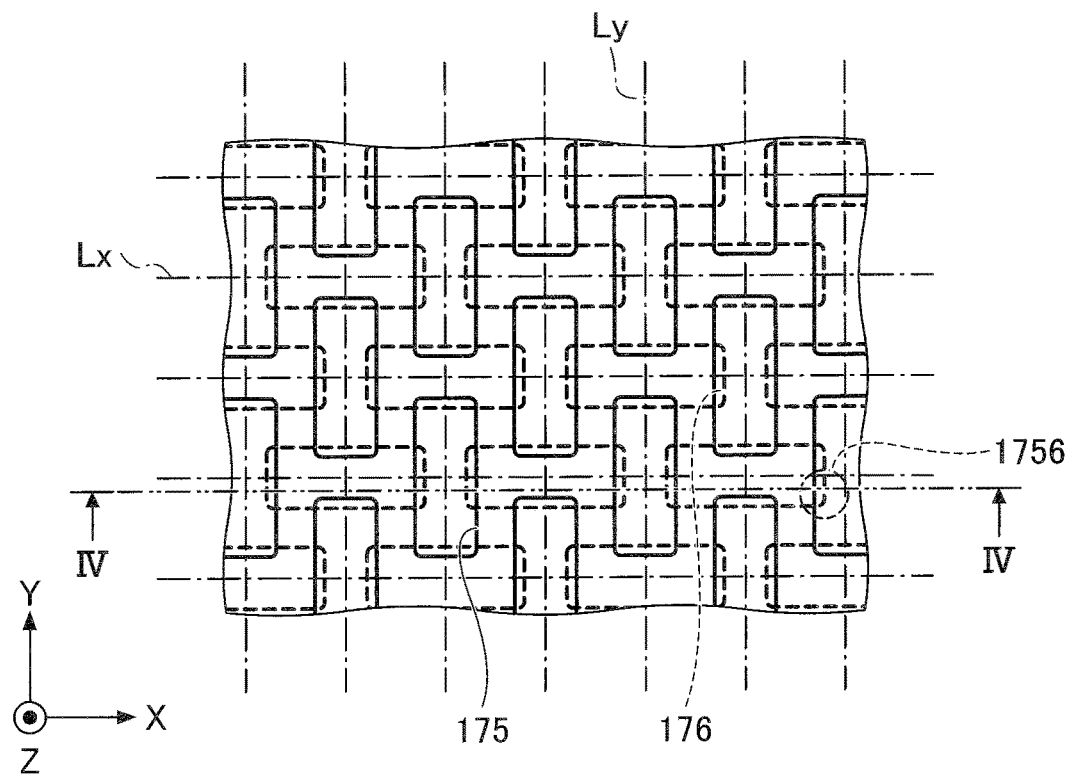

Here, a configuration of the porous body 150 is described with reference to FIGS. 7A and 7B and FIGS. 8A and 8B. FIG. 7A illustrates an arrangement of through holes 172 in the metal layer 162 of the second layer and an arrangement of through holes 173 in the metal layer 163 of the third layer in a plan view. FIG. 7B illustrates an arrangement of through holes 175 in the metal layer 165 of the fifth layer and an arrangement of through holes 176 in the metal layer 166 of the sixth layer in a plan view. FIG. 8A is a plan view illustrating through hole positions of the stacked metal layers 162 and 163. FIG. 8B is a plan view illustrating through hole positions of the stacked metal layers 165 and 166. The cross section of the porous body 150 illustrated in FIG. 4 corresponds to a cross section taken along the line IV-IV in FIGS. 8A and 8B.

In FIGS. 7A through 8B, the Z direction is the stacking direction of the metal layers 161 through 167, the X direction is a direction in a plane perpendicular to the Z direction, and the Y direction is a direction orthogonal to the X direction in the plane. The same applies to the subsequent figures.

Referring to FIGS. 7A through 8B, through holes whose planar shape is rectangular are formed in each metal layer in the porous body 150. The through holes are, for example, disposed at the intersections of virtual straight lines Lx extending in the X direction and virtual straight lines Ly extending in the Y direction. The virtual straight lines Lx (hereinafter "virtual lines Lx") and the virtual straight lines Ly (hereinafter "virtual lines Ly") are arranged at regular intervals K.

In a plan view, the positions of through holes differ between the second metal layer 162 and the third metal layer 163 and between the fifth metal layer 165 and the sixth metal layer 166.

Referring to FIG. 7A, for example, the through holes 172 formed in the metal layer 162 have a rectangular planar shape having a long side parallel to the Y direction and a short side parallel to the X direction. For example, the length of the long side of the through holes 172 is 200 µm to 300 µm, and the length of the short side of the through holes 172 is 100 µm to 200 µm. The through holes 172 are disposed on every other virtual line Ly on each virtual line Lx and on every other virtual line Lx on each virtual line Ly.

Furthermore, for example, the through holes 173 formed in the metal layer 163 have a rectangular planar shape having a long side parallel to the X direction and a short side parallel to the Y direction. For example, the length of the long side of the through holes 173 is 200 µm to 300 µm, and the length of the short side of the through holes 173 is 100 µm to 200 µm. The through holes 173 are disposed on every other virtual line Ly on each virtual line Lx and on every other virtual line Lx on each virtual line Ly. The through holes 173 are disposed at intersections different from the intersections at which the through holes 172 are disposed.

Referring to FIGS. 4 and 8A, the through holes 172 and 173 overlap each other in a plan view, and the overlaps communicate with each other to form pores 1723. For example, the pores 1723 have a rectangular planar shape having a long side of 50 µm to 150 µm in length and a short side of 10 µm to 50 µm in length. The pores 1723 communicate with one another in the metal layers 162 and 163 to spread three-dimensionally in the porous body 150. Therefore, the working fluid C spreads three-dimensionally through the mutually connected pores 1723 through capillary action.

Referring to FIG. 7B, for example, the through holes 175 formed in the metal layer 165 have a rectangular planar shape having a long side parallel to the Y direction and a short side parallel to the X direction. For example, the length of the long side of the through holes 175 is 200 µm to 300 µm, and the length of the short side of the through holes 175 is 100 µm to 200 µm. The through holes 175 are disposed on every other virtual line Ly on each virtual line Lx and on every other virtual line Lx on each virtual line Ly.

Furthermore, for example, the through holes 176 formed in the metal layer 166 have a rectangular planar shape having a long side parallel to the X direction and a short side parallel to the Y direction. For example, the length of the long side of the through holes 176 is 200 µm to 300 µm, and the length of the short side of the through holes 176 is 100 µm to 200 µm. The through holes 176 are disposed on every other virtual line Ly on each virtual line Lx and on every other virtual line Lx on each virtual line Ly. The through holes 176 are disposed at intersections different from the intersections at which the through holes 175 are disposed.

Referring to FIGS. 4 and 8B, the through holes 175 and 176 overlap each other in a plan view, and the overlaps communicate with each other to form pores 1756. For example, the pores 1756 have a rectangular planar shape having a long side of 50 µm to 150 µm in length and a short side of 10 µm to 50 µm in length. The pores 1756 communicate with one another in the metal layers 165 and 166 to spread three-dimensionally in the porous body 150. Therefore, the working fluid C spreads three-dimensionally through the mutually connected pores 1756 through capillary action.

Thus, the porous body 150 is provided in the liquid pipe 140, and the liquid-phase working fluid C in the liquid pipe 140 is guided to the evaporator 110 by a capillary force generated in the porous body 150.

As a result, even when the vapor Cv is urged to reversely flow in the liquid pipe 140 by heat leak from the evaporator 110 or the like, a capillary force that acts on the liquid-phase working fluid C from the porous body 150 can push back the vapor Cv to prevent the backflow of the vapor Cv.

Furthermore, as described above, the porous body 150 is also provided in the evaporator 110. In the evaporator 110, the liquid-phase working fluid C permeates part of the porous body 150 closer to the liquid pipe 140. At this point, a capillary force acting on the working fluid C from the porous body 150 serves as a pumping force to circulate the working fluid C in the loop heat pipe 100.

In addition, this capillary force counters the vapor Cv in the evaporator 110. Therefore, it is possible to prevent the vapor Cv from reversely flowing into the liquid pipe 140.

An inlet port (not depicted) for injecting the working fluid C is formed on the liquid pipe 140. The inlet port is sealed to keep the loop heat pipe 100 airtight.

Figure 26:
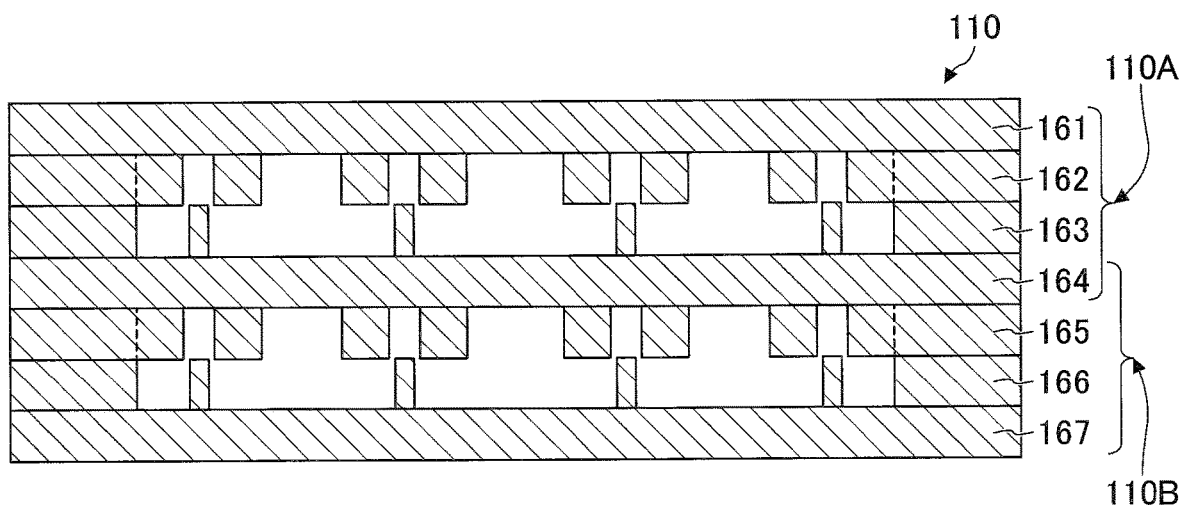
FIG. 26 is a cross-sectional view illustrating a configuration of the evaporator according to the first embodiment.
Figure 27:
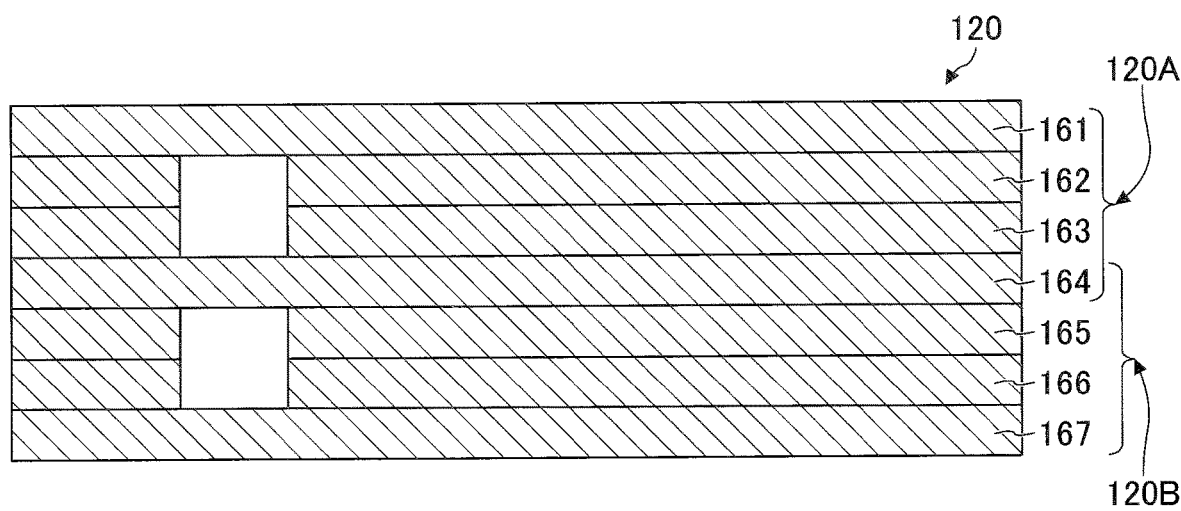
FIG. 27 is a cross-sectional view illustrating a configuration of a condenser according to the first embodiment.

The loop heat pipe 100 thus includes the evaporator 110, the condenser 120, the vapor pipe 130, the liquid pipe 140, and the porous body 150. The evaporator 110, the condenser 120, the vapor pipe 130, the liquid pipe 140, and the porous body 150 are formed by stacking the metal layers 161 through 167. Of the metal layers 161 through 167, the metal layer 160B (the metal layers 162, 163, 165 and 166) includes the opening 168, and the metal layer 160A (the metal layers 161, 164 and 167) is a solid metal layer in which no opening is formed. Accordingly, the metal layers 161 through 164 form a single loop flow path (the first flow path 101A), and the metal layers 164 through 167 form a single loop flow path (the second flow path 101B). That is, according to the loop heat pipe 100, the evaporator 110, the condenser 120, the vapor pipe 130, and the liquid pipe 140 are divided into two parts by the metal layer 164 in the thickness direction of the loop heat pipe 100. That is, as illustrated in FIGS. 3, 4, 26 and 27, the evaporator 110 is divided into a first evaporator 110A and a second evaporator 110B, the condenser 120 is divided into a first condenser 120A and a second condenser 120B, the vapor pipe 130 is divided into a first vapor pipe 130A and a second vapor pipe 130B, and the liquid pipe 140 is divided into a first liquid pipe 140A and a second liquid pipe 140B. Furthermore, the porous body 150 includes a first porous body 150A provided in the liquid pipe 140 in the first flow path 101A and a second porous body 150B provided in the liquid pipe 140 in the second flow path 101B. FIG. 26 is a cross-sectional view taken along the line XXVI-XXVI in FIG. 1, illustrating a configuration of the evaporator 110 according to the first embodiment. FIG. 27 is a cross-sectional view taken along the line XXVII-XXVII in FIG. 1, illustrating a configuration of the condenser 120 according to the first embodiment. The metal layer 164 is an example of a divider (for example, a dividing plate). Referring to FIG. 3, the metal layer 164 includes an upper (first) surface 164a exposed to the first flow path 101A, and a lower (second) surface 164b exposed to the second flow path 101B.

In other words, the metal layers 161 through 164 form the first evaporator 110A, the first condenser 120A, the first vapor pipe 130A, the first liquid pipe 140A, and the first porous body 150A, and the metal layers 164 through 167 form the second evaporator 110B, the second condenser 120B, the second vapor pipe 130B, the second liquid pipe 140B, and the second porous body 150B. In the thickness direction of the plate-shaped loop heat pipe 100, the first evaporator 110A and the second evaporator 110B are positioned one over the other, the first condenser 120A and the second condenser 120B are positioned one over the other, the first vapor pipe 130A and the second vapor pipe 130B are positioned one over the other, and the first liquid pipe 140A and the second liquid pipe 140B are positioned one over the other.

The working fluid C may be caused to differ in the range of operating temperatures between the first flow path 101A and the second flow path 101B.

For example, the range of operating temperatures can be caused to differ between the first flow path 101A and the second flow path 101B by sealing the same substance into the first flow path 101A and the second flow path 101B at different internal pressures. For example, water may be sealed into the first flow path 101A at an internal pressure of 200 hPa and into the second flow path 101B at an internal pressure of 40 hPa. The boiling point of water is approximately 60° C. at a pressure of 200 hPa and approximately 30° C. at a pressure of 40 hPa. Therefore, in this case, the first evaporator 110A starts to operate at approximately 60° C. in the first flow path 101A whose internal pressure is 200 hPa, and the second evaporator 110B starts to operate at approximately 30° C. in the second flow path 101B whose internal pressure is 40 hPa. Accordingly, the evaporator 110 starts to operate at a temperature of approximately 30° C. When the ambient temperature becomes higher, for example, 60° C., the fluidity of the working fluid C decreases in the second flow path 101B, but the first evaporator 110A starts to operate. Therefore, the loop heat pipe 100 can continue to operate. That is, according to the first embodiment, it is possible to widen the range of operating temperatures and prevent a decrease in the heat transport performance due to an increase in the ambient temperature.

Furthermore, for example, it is possible to cause the range of operating temperatures to differ between the first flow path 101A and the second flow path 101B by equalizing the internal pressures of and sealing different substances into the first flow path 101A and the second flow path 101B. For example, water may be sealed into the first flow path 101A at an internal pressure of 200 hPa, and a liquid mixture of water and ethanol may be sealed into the second flow path 101B at an internal pressure of 200 hPa. The boiling point of a liquid mixture of water and ethanol is lower than the boiling point of water. Accordingly, in this case as well, it is possible to widen the range of operating temperatures and prevent a decrease in the heat transport performance due to an increase in the ambient temperature.

Referring to FIG. 2, the upper surface of the heat generating component 12 adheres to the lower surface of the evaporator 110, and the working fluid C is preferably sealed into the first flow path 101A and the second flow path 101B such that the operating temperature of one of the first and second evaporators 110A and 110B closer to the heat generating component 12 is lower than the operating temperature of the other of the first and second evaporators 110A and 110B on the opposite side of the metal layer 164. The mode of sealing the working fluid C, however, is not limited to this, and the working fluid C may be sealed into the first flow path 101A and the second flow path 101B such that the operating temperature of the one of the first and second evaporators 110A and 110B is higher than the operating temperature of the other of the first and second evaporators 110A and 110B.

Next, a method of manufacturing the loop heat pipe 100 according to the first embodiment is described, focusing on the process of manufacturing a porous body. FIGS. 9A through 9F are diagrams illustrating a process of manufacturing a loop heat pipe according to the first embodiment, depicting a cross section corresponding to FIG. 4.

Figure 9A:
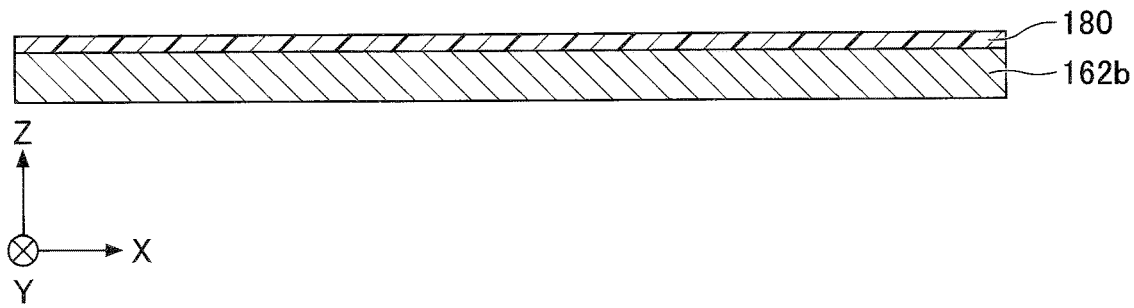
FIGS. 9A through 9F are diagrams illustrating a process of manufacturing a loop heat pipe according to the first embodiment.

First, in the process depicted in FIG. 9A, a metal sheet 162b so formed as to have a planar shape illustrated in FIG. 1 is prepared, and a resist layer 180 is formed on the upper surface of the metal sheet 162b. The metal sheet 162b, which is a member to ultimately become the metal layer 162, may be formed of, for example, copper, stainless steel, aluminum, or a magnesium alloy. The thickness of the metal sheet 162b may be, for example, approximately 50 µm to approximately 200 µm. For example, a photosensitive dry film resist may be used as the resist layer 180.

Figure 9B:
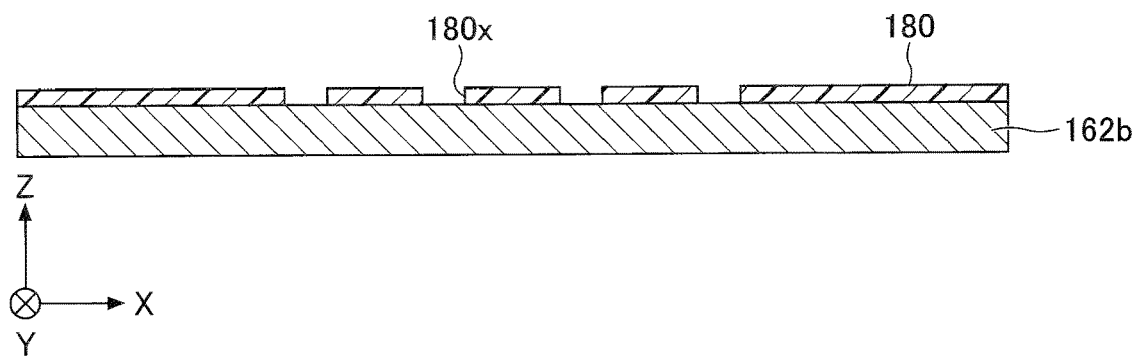

Next, in the process depicted in FIG. 9B, in a region of the metal sheet 162b in which the porous body 150 is to be formed (for example, a region to become the liquid pipe 140), the resist layer 180 is exposed to light and developed to form openings 180x that selectively expose the upper surface of the metal sheet 162b. The shape and arrangement of the openings 180x correspond to the shape and arrangement of the through holes 172 illustrated in FIG. 7A.

Figure 9C:
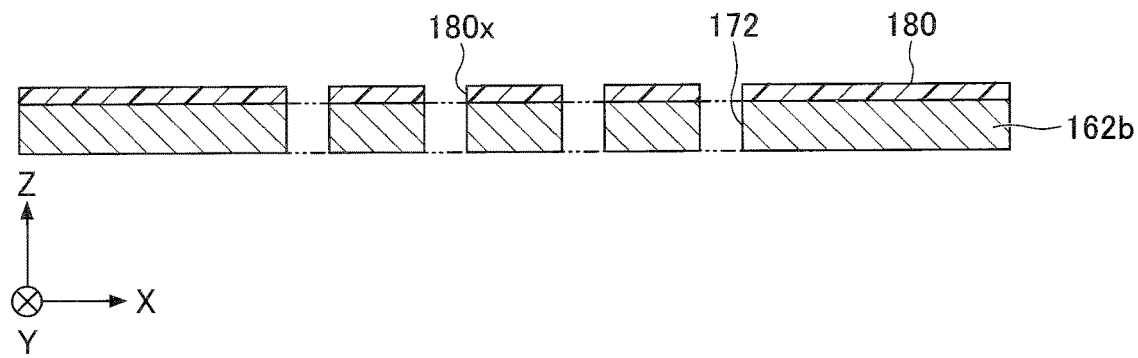

Next, in the process depicted in FIG. 9C, the metal sheet 162b exposed in the openings 180x is etched from the upper surface of the metal sheet 162b. As a result, the through holes 172 are formed in the metal sheet 162b. For example, a ferric chloride solution may be used to etch the metal sheet 162b.

Figure 9D:
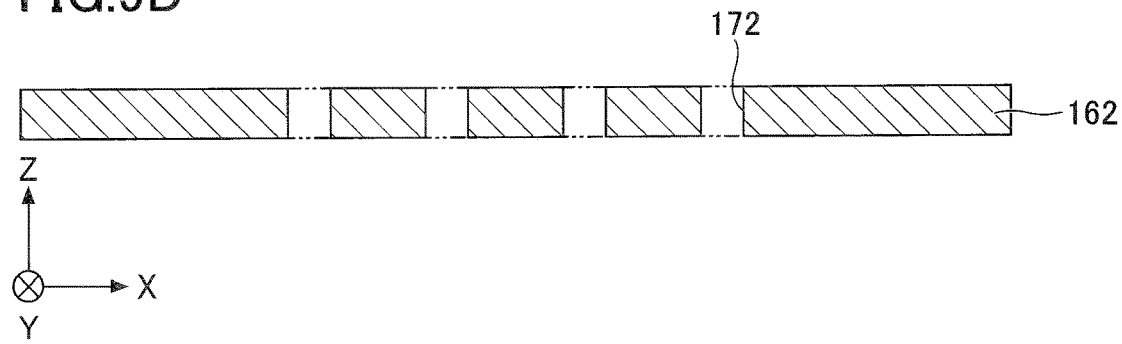

Next, in the process depicted in FIG. 9D, the resist layer 180 is removed using a stripping solution. As a result, the metal layer 162 is completed.

Figure 9E:
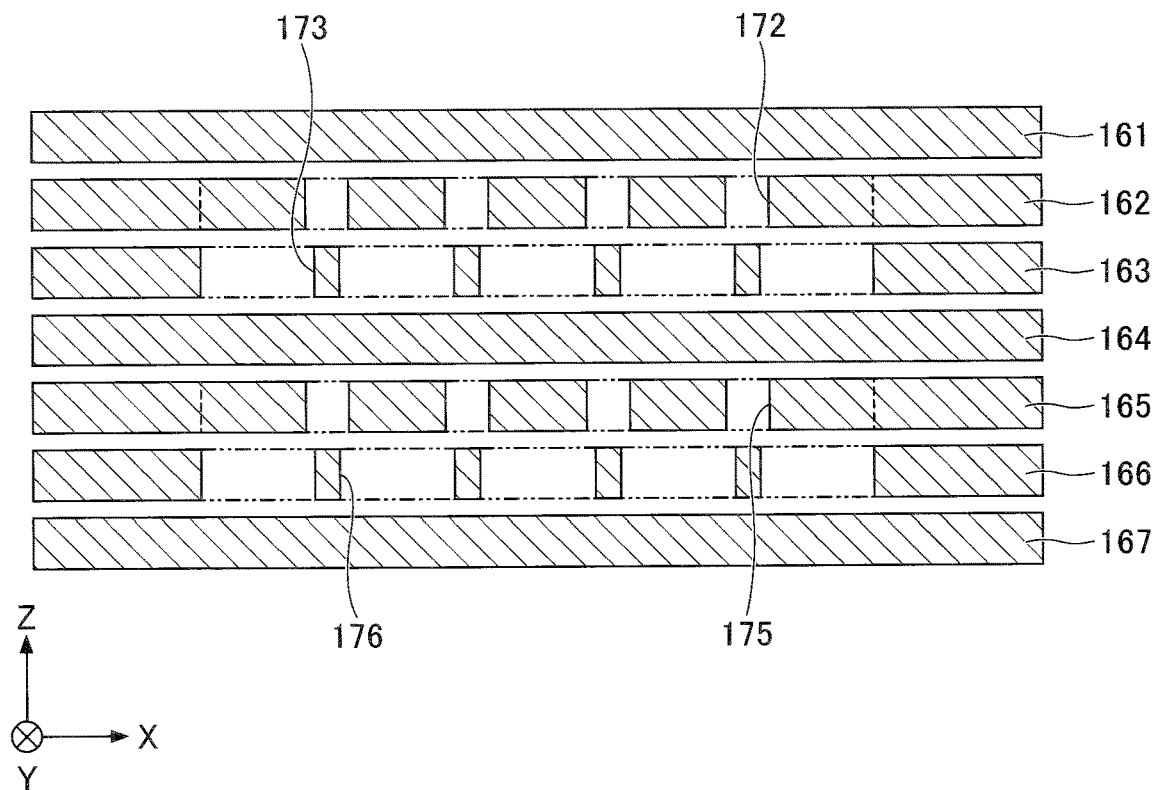

Next, in the process depicted in FIG. 9E, the solid metal layers 161, 164 and 167 in which no holes or grooves are formed are prepared. Furthermore, the metal layers 163, 165 and 166 are formed in the same manner as the metal layer 162. The through holes formed in the metal layers 163, 165 and 166 are positioned, for example, as illustrated in FIGS. 7A and 7B.

Figure 9F:
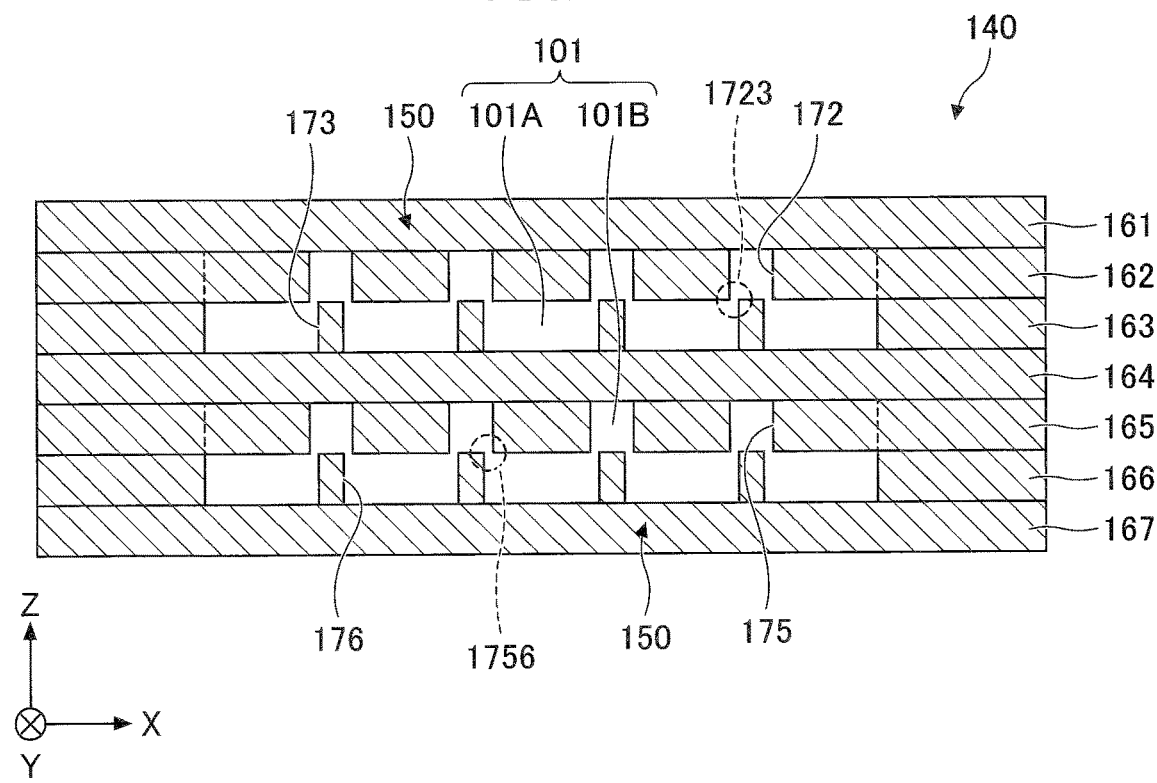

Next, in the process depicted in FIG. 9F, the metal layers 161 through 167 are stacked in the order illustrated in FIG. 9E, and are joined by solid-state welding through application of pressure and heat. As a result, adjacent metal layers are directly joined to each other to form the evaporator 110, the condenser 120, the vapor pipe 130, and the liquid pipe 140 and form the porous body 150 in the liquid pipe 140 and the evaporator 110. Thereafter, the liquid pipe 140 is evacuated using a vacuum pump or the like, and the working fluid C is thereafter injected into the first flow path 101A and the second flow path 101B separately through the inlet port (not depicted). Thereafter, the inlet port is sealed.

At this point, for example, the first flow path 101A and the second flow path 101B may have different internal pressures, and the same substance may be injected into the first flow path 101A and the second flow path 101B as the working fluid C. Alternatively, the first flow path 101A and the second flow path 101B may have the same internal pressure, and substances having different boiling points at the internal pressure may be injected into the first flow path 101A and the second flow path 101B as the working fluid C.

Here, the solid-state welding refers to a process of joining work pieces together by heating and softening the work pieces in solid phase (solid state) without melting the work pieces and plastically deforming the work pieces by further applying pressure. The metal layers 161 through 167 are preferably formed of the same material so that adjacent metal layers can be satisfactorily joined together by solid-state welding.

In this manner, the loop heat pipe 100 according to the first embodiment can be manufactured.

[b] Second Embodiment

Next, a description is given of a second embodiment, which relates to a loop heat pipe. The second embodiment is different from the first embodiment in the configuration of a porous body.

Figure 10:
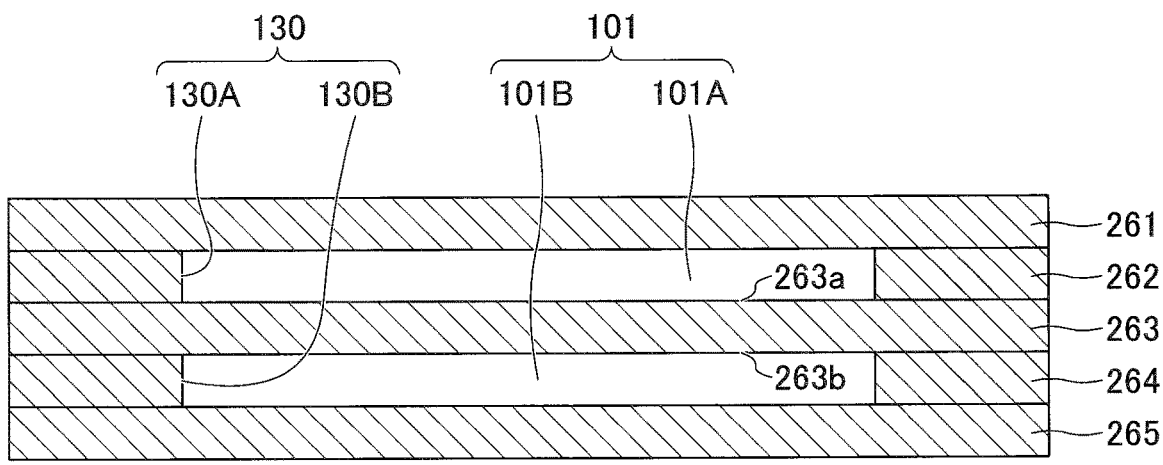
FIG. 10 is a cross-sectional view illustrating a configuration of the vapor pipe of the loop heat pipe according to a second embodiment.
Figure 11:
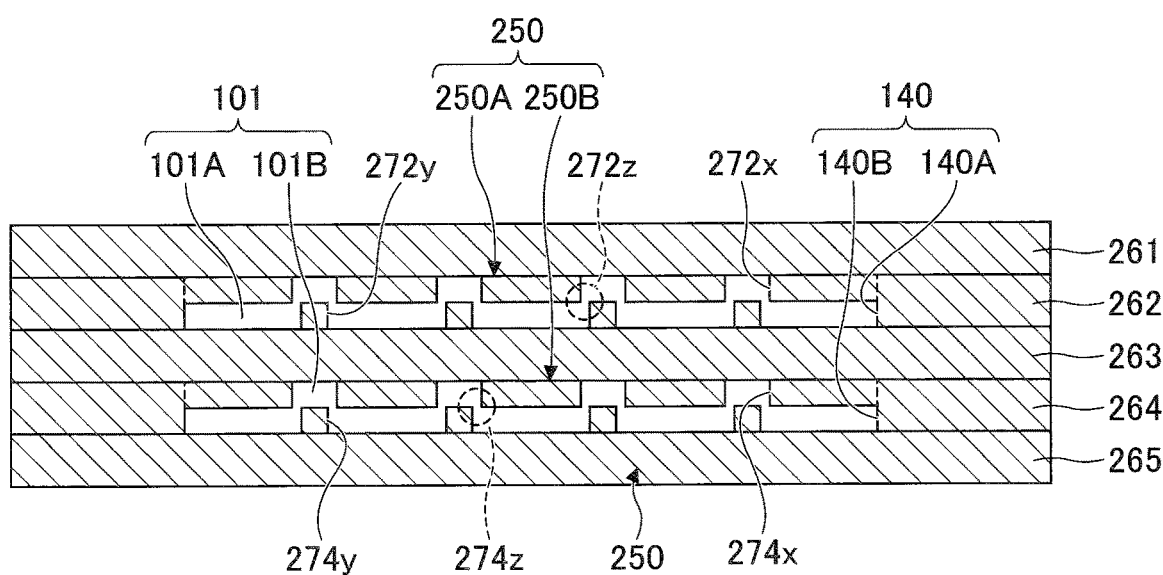
FIG. 11 is a cross-sectional view illustrating a configuration of the liquid pipe of the loop heat pipe according to the second embodiment.

A configuration of the vapor pipe 130 and a configuration of the liquid pipe 140 according to the second embodiment are described. FIG. 10 is a cross-sectional view illustrating a configuration of the vapor pipe 130, corresponding to a cross-sectional view taken along the line in FIG. 1. FIG. 11 is a cross-sectional view illustrating a configuration of the liquid pipe 140, corresponding to a cross-sectional view taken along the line IV-IV in FIG. 1.

The vapor pipe 130 and the liquid pipe 140 may have a laminated structure of, for example, five metal layers 261 through 265. The metal layers 261 through 265 are, for example, copper layers, which have good thermal conductivity, and are directly joined together by, for example, solid-state welding. The thickness of each of the metal layers 261 through 265 may be, for example, approximately 50 µm to approximately 200 µm. The metal layers 261 through 263 form the first flow path 101A, and the metal layers 263 through 265 form the second flow path 101B. A porous body 250 is provided in the liquid pipe 140. The metal layers 261 through 265 are not limited to copper layers, and may be, for example, stainless steel layers, aluminum layers, or magnesium alloy layers.

Figure 12:
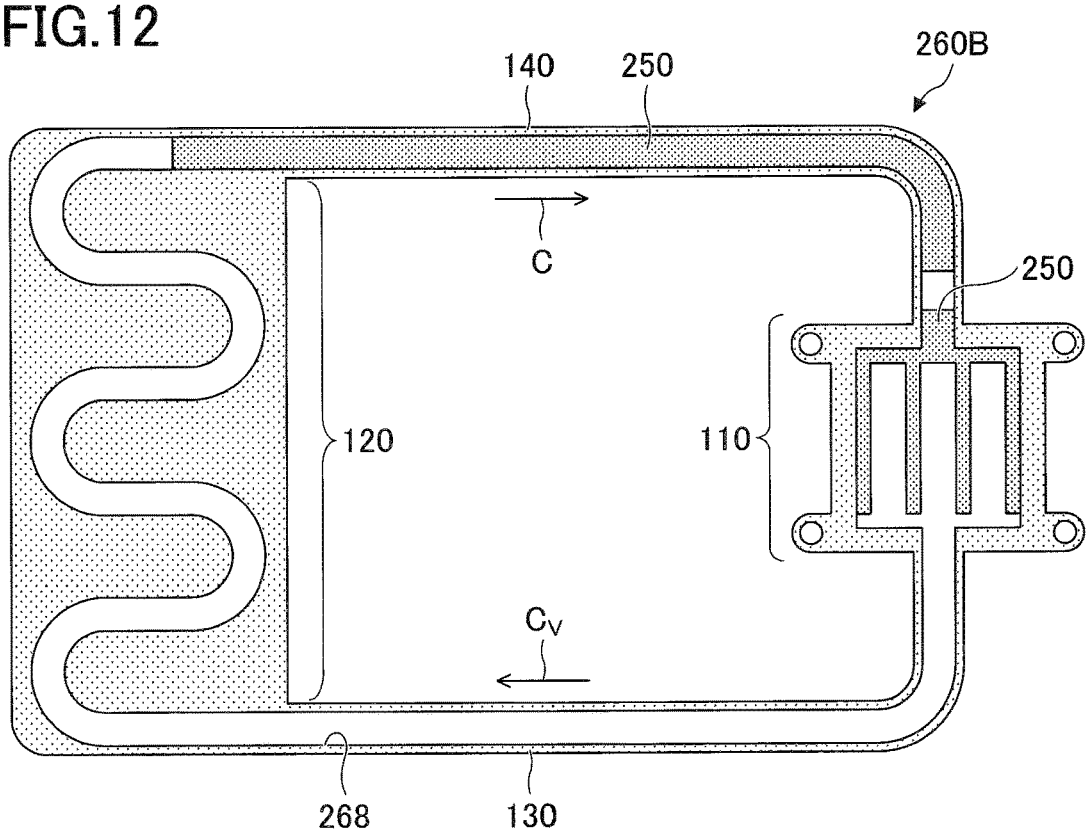
FIG. 12 is a plan view illustrating a configuration of a metal layer of the loop heat pipe according to the second embodiment.
Figure 13:
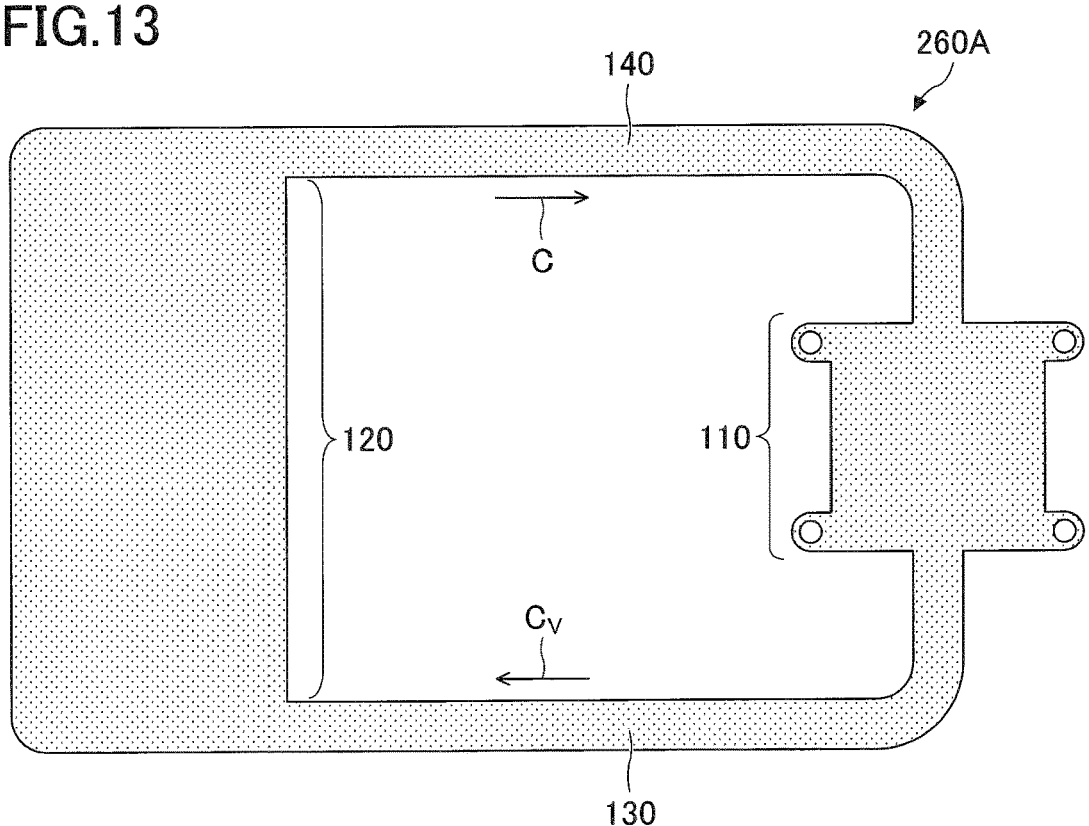
FIG. 13 is a plan view illustrating a configuration of a metal layer of the loop heat pipe according to the second embodiment.

Next, a configuration of the metal layers 261 through 265 is described. FIG. 12 is a plan view illustrating a configuration of the metal layers 262 and 264. FIG. 13 is a plan view illustrating a configuration of the metal layers 261, 263 and 265. Hereinafter, the metal layer 261 of the first layer (one of the outermost layers), the metal layer 263 of the third (central) layer, and the metal layer 265 of the fifth layer (the other of the outermost layers) may be collectively referred to as "metal layer 260A." Furthermore, the other metal layers 262 and 264 may be collectively referred to as "metal layer 260B."

Referring to FIG. 12, an opening 268 extending along the movement direction of the working fluid C is formed in the metal layer 260B. Furthermore, the porous body 250 is provided in the opening 268 in the liquid pipe 140. The porous body 250 extends from the condenser 120 to the evaporator 110 along the liquid pipe 140. The porous body 250 is also provided in the evaporator 110. The porous body 250 includes bottomed holes (i.e., holes having a bottom) formed in the metal layer 260B. The porous body 250 is described in detail below.

Referring to FIG. 13, the outline of the metal layer 260A coincides with the outline of the metal layer 260B in a plan view. The metal layer 260A, however, is a solid metal layer in which the opening 268 is not formed.

Figure 14A:
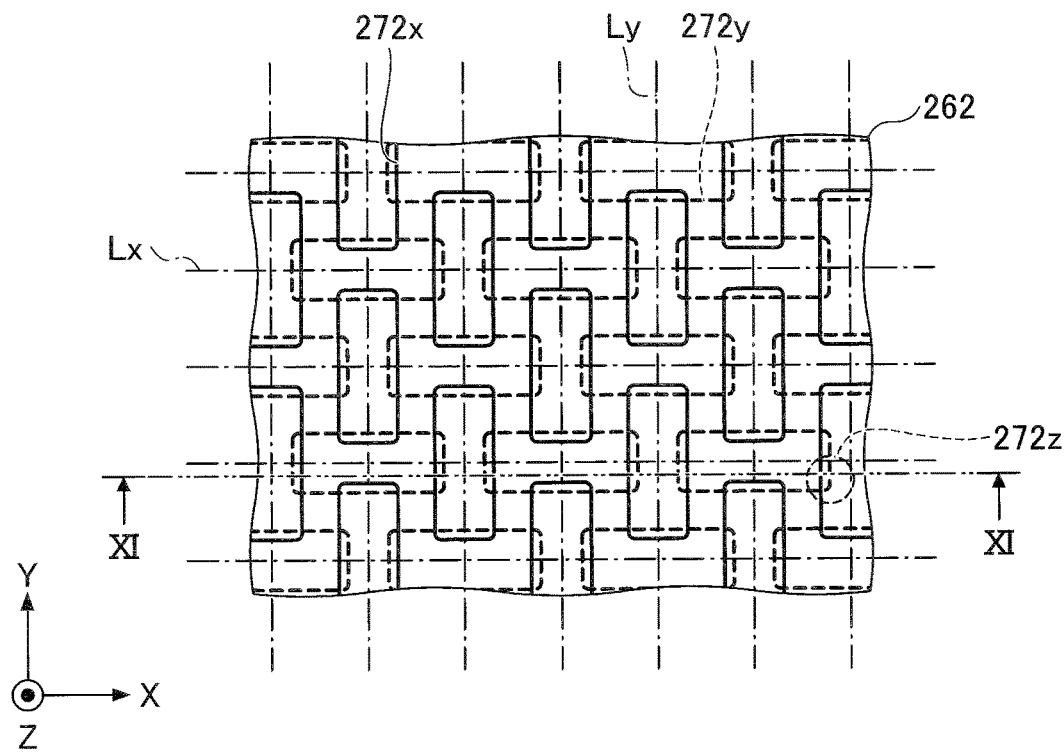
FIGS. 14A and 14B are plan views each illustrating an arrangement of bottomed holes.
Figure 14B:
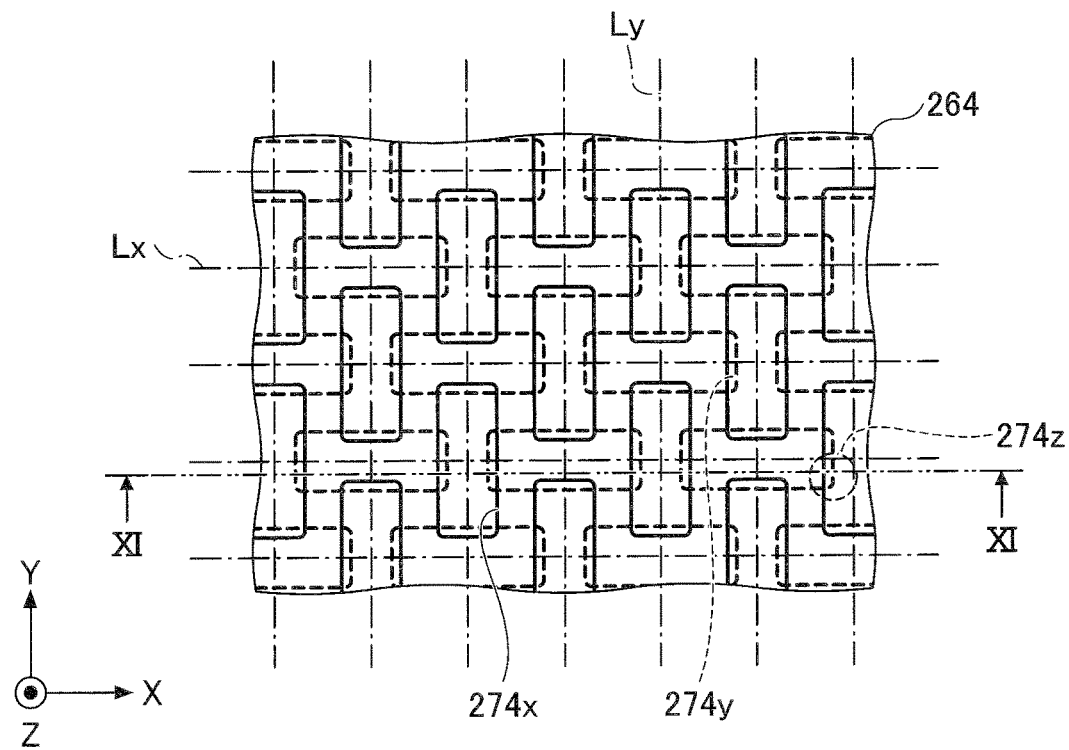

Here, a configuration of the porous body 250 is described with reference to FIGS. 14A and 14B. FIG. 14A is a plan view illustrating an arrangement of bottomed holes in the metal layer 262 of the second layer. FIG. 14B is a plan view illustrating an arrangement of bottomed holes in the metal layer 264 of the fourth layer. The cross section of the porous body 250 illustrated in FIG. 11 corresponds to a cross section taken along the line XI-XI in FIGS. 14A and 14B.

Referring to FIGS. 11 and 14A, in the metal layer 262, bottomed holes 272x recessed from the upper surface and extending to the substantial center of the metal layer 262 in the thickness direction and bottomed holes 272y recessed from the lower surface and extending to the substantial center of the metal layer 262 in the thickness direction are formed in the porous body 250, such that the bottomed holes 272x are depressed relative to the upper surface of the metal layer 262 and the bottomed holes 272y are depressed relative to the lower surface of the metal layer 262.

The bottomed holes 272x have a rectangular planar shape having a long side parallel to the Y direction and a short side parallel to the X direction. For example, the length of the long side of the bottomed holes 272x is 200 µm to 300 µm, and the length of the short side of the bottomed holes 272x is 100 µm to 200 µm. The bottomed holes 272x are disposed on every other virtual line Ly on each virtual line Lx and on every other virtual line Lx on each virtual line Ly.

The bottomed holes 272y have a rectangular planar shape having a long side parallel to the X direction and a short side parallel to the Y direction. For example, the length of the long side of the bottomed holes 272y is 200 µm to 300 µm, and the length of the short side of the bottomed holes 272y is 100 µm to 200 µm. The bottomed holes 272y are disposed on every other virtual line Ly on each virtual line Lx and on every other virtual line Lx on each virtual line Ly. The bottomed holes 272y are disposed at intersections different from the intersections at which the bottomed holes 272x are disposed.

The bottomed holes 272x and 272y overlap each other in a plan view, and the overlaps communicate with each other to form pores 272z as illustrated in FIGS. 11 and 14A. For example, the pores 272z have a rectangular planar shape having a long side of 50 pin to 150 µm in length and a short side of 10 µm to 50 µm in length. The pores 272z communicate with one another in the metal layer 262 to spread three-dimensionally in the porous body 250. Therefore, the working fluid C spreads three-dimensionally through the mutually connected pores 272z through capillary action.

Referring to FIGS. 11 and 14B, in the metal layer 264, bottomed holes 274x recessed from the upper surface and extending to the substantial center of the metal layer 264 in the thickness direction and bottomed holes 274y recessed from the lower surface and extending to the substantial center of the metal layer 264 in the thickness direction are formed in the porous body 250, such that the bottomed holes 274x are depressed relative to the upper surface of the metal layer 264 and the bottomed holes 274y are depressed relative to the lower surface of the metal layer 264.

The bottomed holes 274x have a rectangular planar shape having a long side parallel to the Y direction and a short side parallel to the X direction. For example, the length of the long side of the bottomed holes 274x is 200 µm to 300 µm, and the length of the short side of the bottomed holes 274x is 100 µm to 200 µm. The bottomed holes 274x are disposed on every other virtual line Ly on each virtual line Lx and on every other virtual line Lx on each virtual line Ly.

The bottomed holes 274y have a rectangular planar shape having a long side parallel to the X direction and a short side parallel to the Y direction. For example, the length of the long side of the bottomed holes 274y is 200 µm to 300 µm, and the length of the short side of the bottomed holes 274y is 100 µm to 200 µm. The bottomed holes 274y are disposed on every other virtual line Ly on each virtual line Lx and on every other virtual line Lx on each virtual line Ly. The bottomed holes 274y are disposed at intersections different from the intersections at which the bottomed holes 274x are disposed.

The bottomed holes 274x and 274y overlap each other in a plan view, and the overlaps communicate with each other to form pores 274z as illustrated in FIGS. 11 and 14B. For example, the pores 274z have a rectangular planar shape having a long side of 50 µm to 150 µm in length and a short side of 10 µm to 50 µm in length. The pores 274z communicate with one another in the metal layer 264 to spread three-dimensionally in the porous body 250. Therefore, the working fluid C spreads three-dimensionally through the mutually connected pores 274z through capillary action.

Thus, the porous body 250 is provided in the liquid pipe 140, and the liquid-phase working fluid C in the liquid pipe 140 is guided to the evaporator 110 by a capillary force generated in the porous body 250.

As a result, even when the vapor Cv is urged to reversely flow in the liquid pipe 140 by heat leak from the evaporator 110 or the like, a capillary force that acts on the liquid-phase working fluid C from the porous body 250 can push back the vapor Cv to prevent the backflow of the vapor Cv.

Furthermore, as described above, the porous body 250 is also provided in the evaporator 110. In the evaporator 110, the liquid-phase working fluid C permeates part of the porous body 250 closer to the liquid pipe 140. At this point, a capillary force acting on the working fluid C from the porous body 250 serves as a pumping force to circulate the working fluid C in the loop heat pipe 100.

In addition, this capillary force counters the vapor Cv in the evaporator 110. Therefore, it is possible to prevent the vapor Cv from reversely flowing into the liquid pipe 140.

The inlet port (not depicted) for injecting the working fluid C formed on the liquid pipe 140 is sealed to keep the loop heat pipe 100 airtight.

Figure 28:
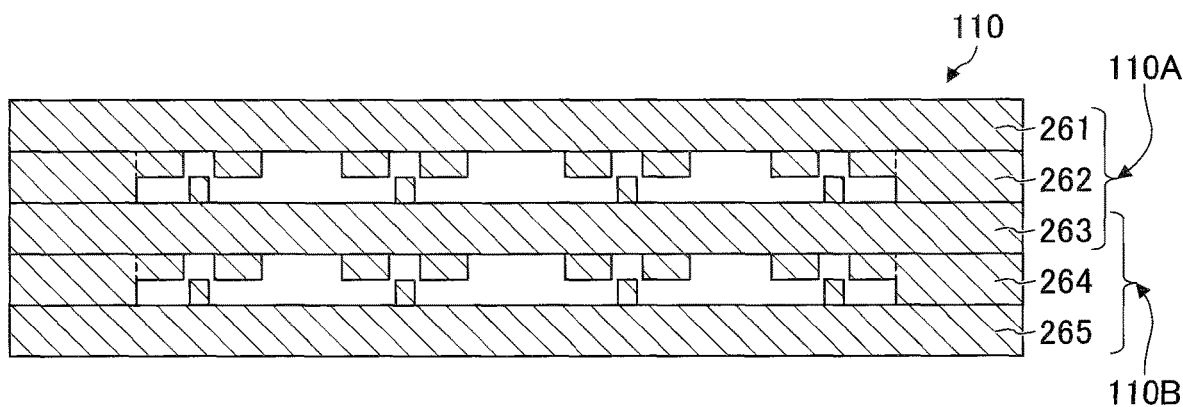
FIG. 28 is a cross-sectional view illustrating a configuration of the evaporator according to the second embodiment.
Figure 29:
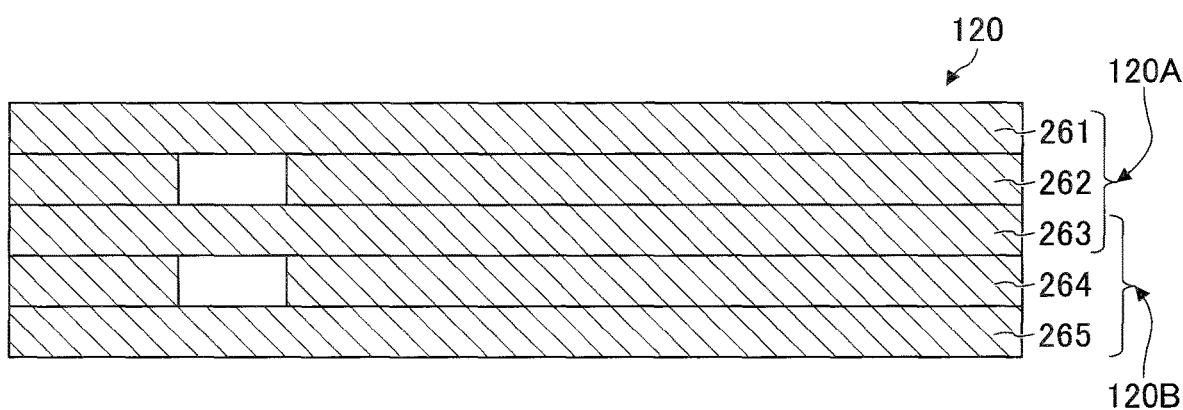
FIG. 29 is a cross-sectional view illustrating a configuration of the condenser according to the second embodiment.

Thus, according to the second embodiment, the loop heat pipe 100 includes the evaporator 110, the condenser 120, the vapor pipe 130, the liquid pipe 140, and the porous body 250. The evaporator 110, the condenser 120, the vapor pipe 130, the liquid pipe 140, and the porous body 250 are formed by stacking the metal layers 261 through 265. Of the metal layers 261 through 265, the metal layer 260B (the metal layers 262 and 264) includes the opening 268, and the metal layer 260A (the metal layers 261, 263 and 265) is a solid metal layer in which no opening is formed. Accordingly, the metal layers 261 through 263 form a single loop flow path (the first flow path 101A), and the metal layers 263 through 265 form a single loop flow path (the second flow path 101B). That is, according to the loop heat pipe 100 of the second embodiment, as illustrated in FIGS. 10, 11, 28 and 29, the evaporator 110, the condenser 120, the vapor pipe 130, and the liquid pipe 140 are divided into two parts by the metal layer 263 in the thickness direction of the loop heat pipe 100. Furthermore, the porous body 250 includes a first porous body 250A provided in the liquid pipe 140 in the first flow path 101A and a second porous body 250B provided in the liquid pipe 140 in the second flow path 101B. FIG. 28 is a cross-sectional view illustrating a configuration of the evaporator 110 according to the second embodiment, corresponding to a cross-sectional view taken along the line XXVI-XXVI in FIG. 1. FIG. 29 is a cross-sectional view illustrating a configuration of the condenser 120 according to the second embodiment, corresponding to a cross-sectional view taken along the line XXVII-XXVII in FIG. 1. The metal layer 263 is an example of the divider. Referring to FIG. 10, the metal layer 263 includes an upper (first) surface 263a exposed to the first flow path 101A, and a lower (second) surface 263b exposed to the second flow path 101B.

In other words, the metal layers 261 through 263 form the first evaporator 110A, the first condenser 120A, the first vapor pipe 130A, the first liquid pipe 140A, and the first porous body 250A, and the metal layers 263 through 265 form the second evaporator 110B, the second condenser 120B, the second vapor pipe 130B, the second liquid pipe 140B, and the second porous body 250B. In the thickness direction of the plate-shaped loop heat pipe 100, the first evaporator 110A and the second evaporator 110B are positioned one over the other, the first condenser 120A and the second condenser 120B are positioned one over the other, the first vapor pipe 130A and the second vapor pipe 130B are positioned one over the other, and the first liquid pipe 140A and the second liquid pipe 140B are positioned one over the other.

The working fluid C may be caused to differ in the range of operating temperatures between the first flow path 101A and the second flow path 101B. The same as in the first embodiment, the working fluid C may be sealed into the first flow path 101A and the second flow path 101B such that the operating temperature of one of the first and second evaporators 110A and 110B closer to the heat generating component 12 is lower than the operating temperature of the other of the first and second evaporators 110A and 110B on the opposite side of the metal layer 263. The mode of sealing the working fluid C, however, is not limited to this, and the working fluid C may be sealed into the first flow path 101A and the second flow path 101B such that the operating temperature of the one of the first and second evaporators 110A and 110B is higher than the operating temperature of the other of the first and second evaporators 110A and 110B.

Thus, according to the second embodiment as well, it is possible to widen the range of operating temperatures and prevent a decrease in the heat transport performance due to an increase in the ambient temperature the same as in the first embodiment. Furthermore, it is possible to reduce the number of metal layers, and accordingly, the thickness of the loop heat pipe 100, compared with the first embodiment.

Next, a method of manufacturing the loop heat pipe 100 according to the second embodiment is described, focusing on the process of manufacturing a porous body. FIGS. 15A through 15F are diagrams illustrating a process of manufacturing a loop heat pipe according to the second embodiment, depicting a cross section corresponding to FIG. 11.

Figure 15A:
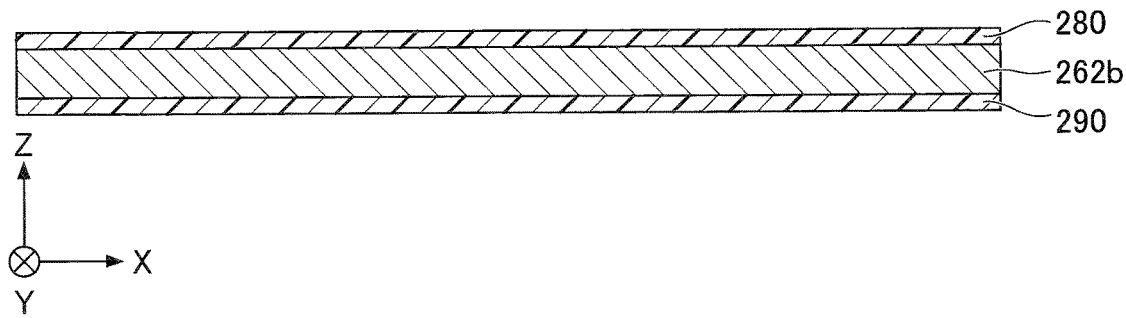
FIGS. 15A through 15F are diagrams illustrating a process of manufacturing a loop heat pipe according to the second embodiment.

First, in the process depicted in FIG. 15A, a metal sheet 262b so formed as to have a planar shape illustrated in FIG. 1 is prepared, and a resist layer 280 and a resist layer 290 are formed on the upper surface and the lower surface, respectively, of the metal sheet 262b. The metal sheet 262b, which is a member to ultimately become the metal layer 262, may be formed of, for example, copper, stainless steel, aluminum, or a magnesium alloy. The thickness of the metal sheet 262b may be, for example, approximately 50 μm to approximately 200 μm. For example, a photosensitive dry film resist may be used as the resist layers 280 and 290.

Figure 15B:
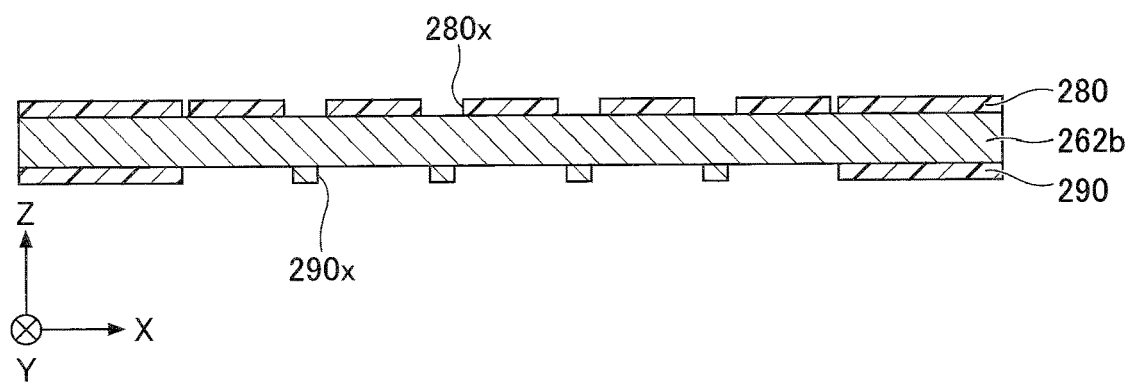

Next, in the process depicted in FIG. 15B, in a region of the metal sheet 262b in which the porous body 250 is to be formed (for example, a region to become the liquid pipe 140), the resist layer 280 is exposed to light and developed to form openings 280x that selectively expose the upper surface of the metal sheet 262b. Furthermore, the resist layer 290 is exposed to light and developed to form openings 290x that selectively expose the lower surface of the metal sheet 262b. The shape and arrangement of the openings 280x and 290x correspond to the shape and arrangement of the bottomed holes 272x and 272y illustrated in FIG. 14A.

Figure 15C:
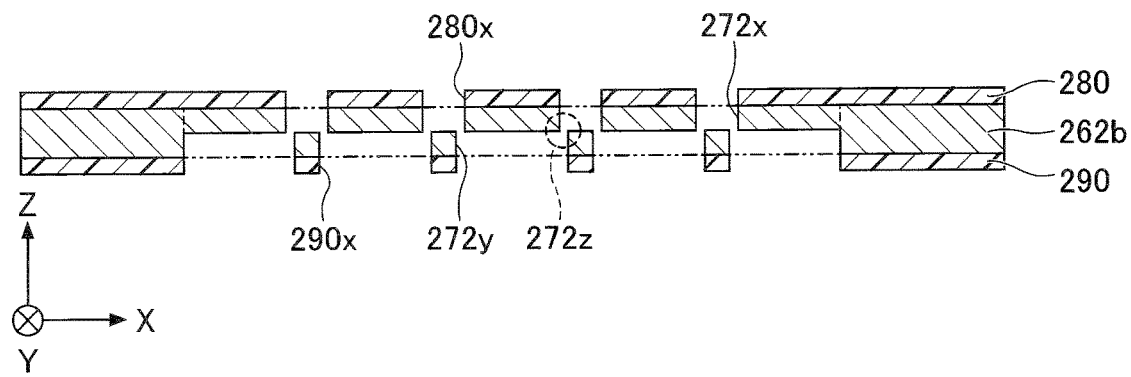

Next, in the process depicted in FIG. 15C, the metal sheet 262b exposed in the openings 280x is half-etched from the upper surface of the metal sheet 262b, and the metal sheet 262b exposed in the openings 290x is half-etched from the lower surface of the metal sheet 262b. As a result, the bottomed holes 272x and the bottomed holes 272y are formed in the upper surface and the lower surface, respectively, of the metal sheet 262b. Furthermore, the openings 280x and 290x, which are so formed on the top side and the bottom side, respectively, of the metal sheet 262b as to be alternately arranged in the X direction, overlap each other in a plan view. Therefore, the overlaps communicate with each other to form the pores 272z. For example, a ferric chloride solution may be used to half-etch the metal sheet 262b.

Figure 15D:
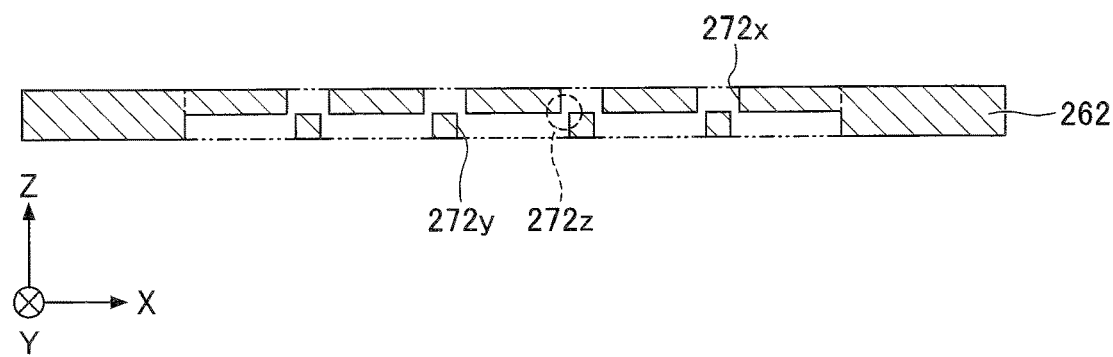

Next, in the process depicted in FIG. 15d, the resist layers 280 and 290 are removed using a stripping solution. As a result, the metal layer 262 is completed.

Figure 15E:
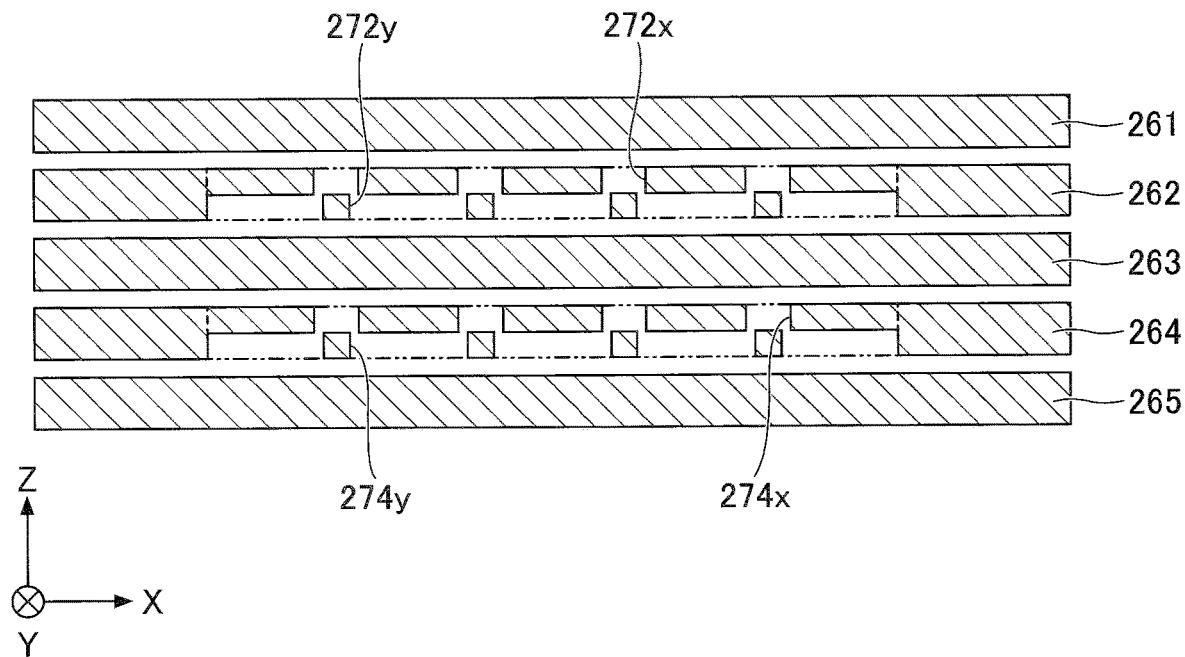

Next, in the process depicted in FIG. 15E, the solid metal layers 261, 263 and 265 in which no holes or grooves are formed are prepared. Furthermore, the metal layer 264 is formed in the same manner as the metal layer 262. The bottomed holes 274x and 274y and the pores 274z formed in the metal layer 264 are positioned, for example, as illustrated in FIG. 14B.

Figure 15F:
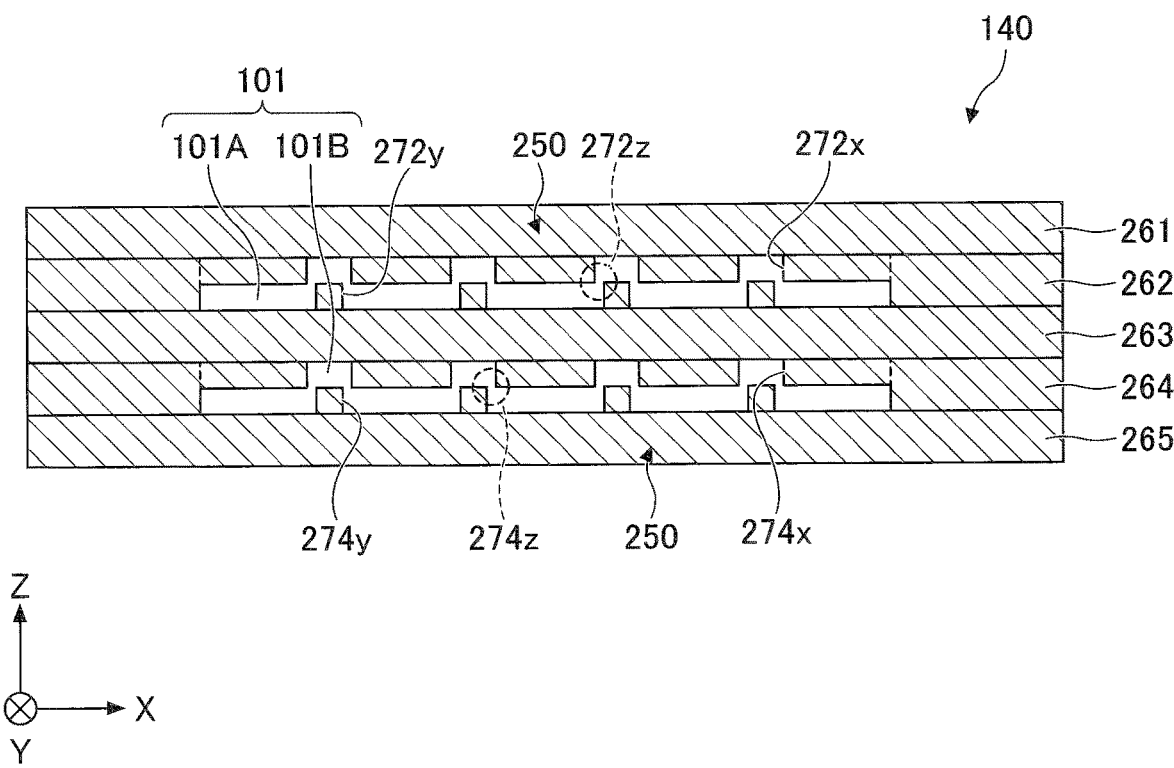

Next, in the process depicted in FIG. 15F, the metal layers 261 through 265 are stacked in the order illustrated in FIG. 15E, and are joined by solid-state welding through application of pressure and heat. As a result, adjacent metal layers are directly joined to each other to form the evaporator 110, the condenser 120, the vapor pipe 130, and the liquid pipe 140 and form the porous body 250 in the liquid pipe 140 and the evaporator 110. Thereafter, the liquid pipe 140 is evacuated using a vacuum pump or the like, and the working fluid C is thereafter injected into the first flow path 101A and the second flow path 101B separately through the inlet port (not depicted). Thereafter, the inlet port is sealed.

At this point, for example, the first flow path 101A and the second flow path 101B may have different internal pressures, and the same substance may be injected into the first flow path 101A and the second flow path 101B as the working fluid C. Alternatively, the first flow path 101A and the second flow path 101B may have the same internal pressure, and substances having different boiling points at the internal pressure may be injected into the first flow path 101A and the second flow path 101B as the working fluid C.

In this manner, the loop heat pipe 100 according to the second embodiment can be manufactured.

Figure 16:
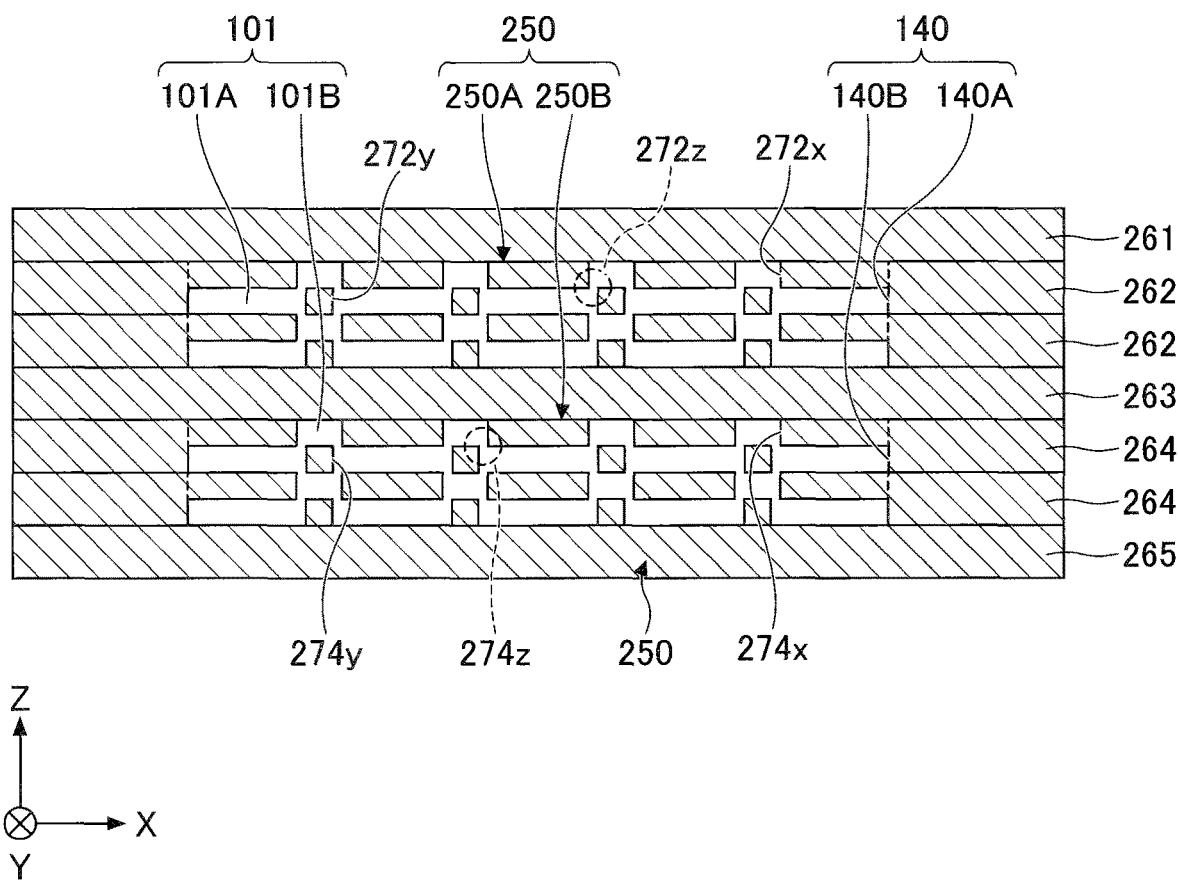
FIG. 16 is a cross-sectional view illustrating a variation of the second embodiment.

According to the second embodiment, two each of the metal layers 262 and 264 may be included. FIG. 16 is a cross-sectional view of the liquid pipe 140 according to a variation of the second embodiment.

Referring to FIG. 16, two metal layers 262 are provided between the metal layer 261 and the metal layer 263, and two metal layers 264 are provided between the metal layer 263 and the metal layer 265.

According to this variation, a larger number of the pores 272z and 274z are included. Therefore, it is possible to further improve the heat transport performance. The evaporator 110, the condenser 120, and the vapor pipe 130 may have the same configuration as in the first embodiment.

[c] Third Embodiment

Next, a description is given of a third embodiment, which relates to a loop heat pipe. The third embodiment is different from the first embodiment in the arrangement of a first flow path and a second flow path.

Figure 17:
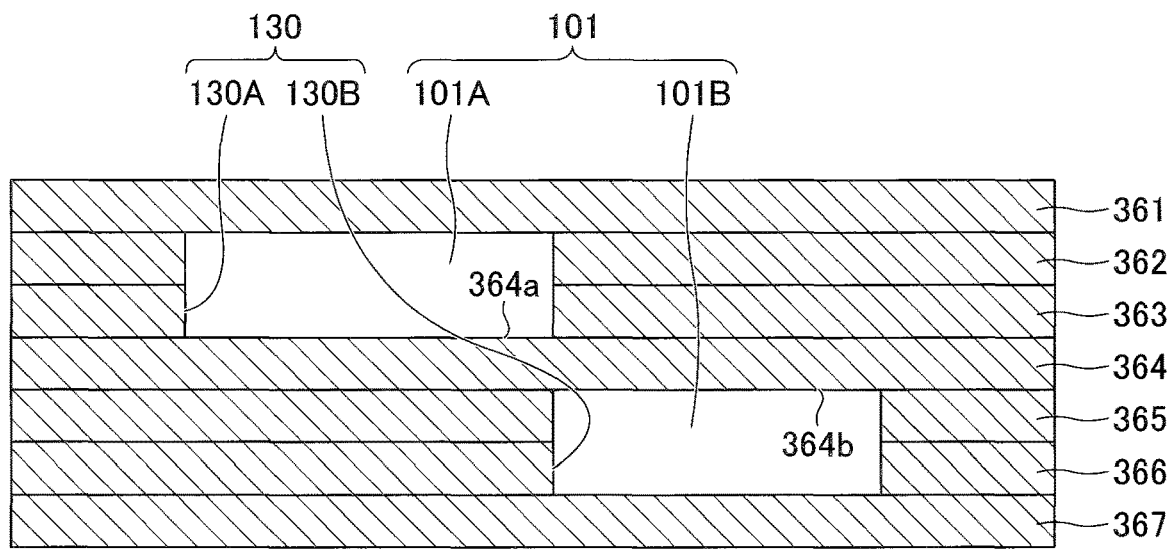
FIG. 17 is a cross-sectional view illustrating a configuration of the vapor pipe of the loop heat pipe according to a third embodiment.
Figure 18:
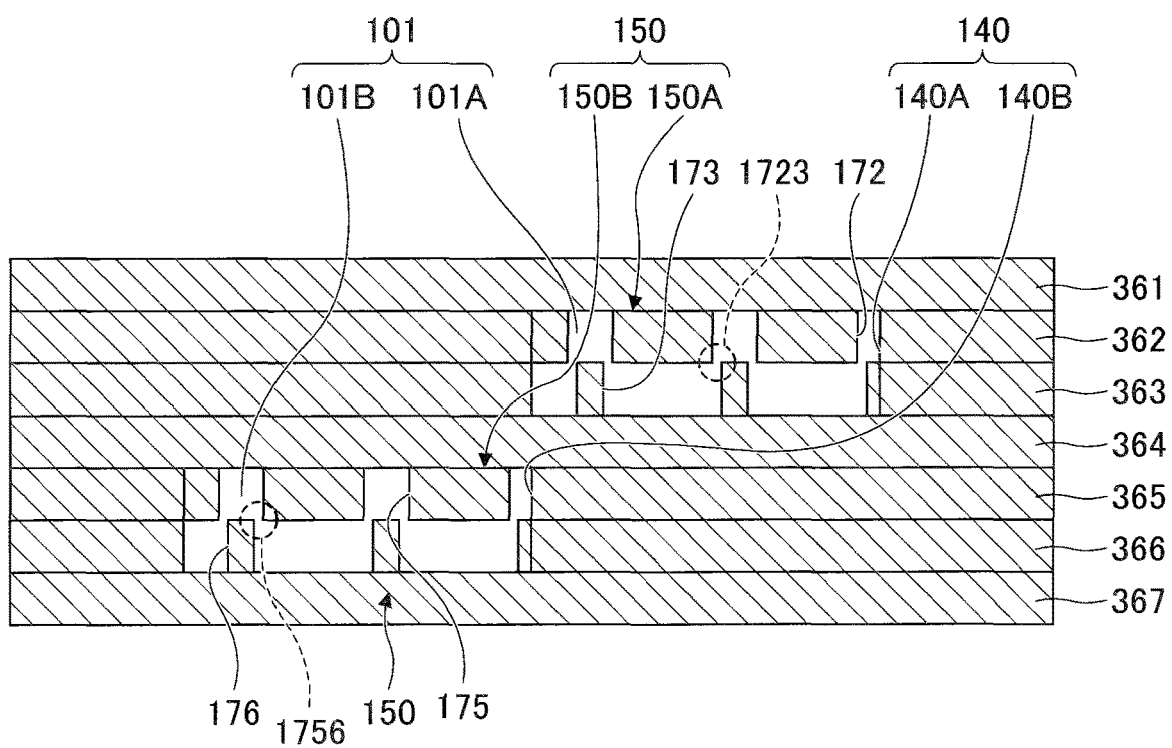
FIG. 18 is a cross-sectional view illustrating a configuration of the liquid pipe of the loop heat pipe according to the third embodiment.
Figure 30:
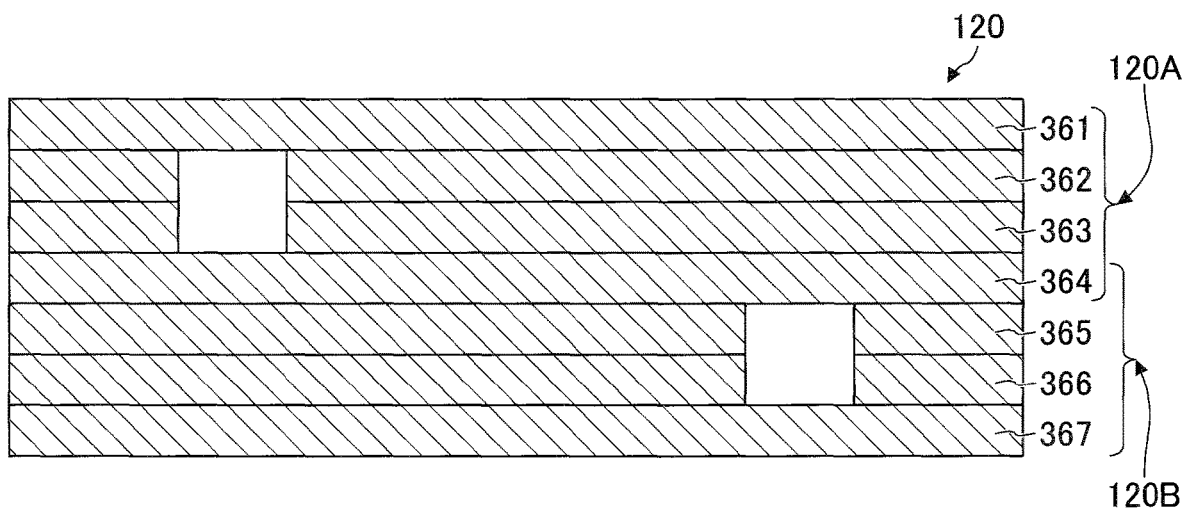
FIG. 30 is a cross-sectional view illustrating a configuration of the condenser according to the third embodiment.

FIG. 17 is a cross-sectional view illustrating a configuration of the vapor pipe 130 of the loop heat pipe 100 according to the third embodiment, corresponding to a cross-sectional view taken along the line of FIG. 1. FIG. 18 is a cross-sectional view illustrating a configuration of the liquid pipe 140 of the loop heat pipe 100 according to the third embodiment, corresponding to a cross-sectional view taken along the line IV-IV of FIG. 1. FIG. 30 is a cross-sectional view illustrating a configuration of the condenser according to the third embodiment, corresponding to a cross-sectional view taken along the line XXVII-XXVII in FIG. 1. The evaporator 110 may have the same configuration as in the first embodiment.

The vapor pipe 130 and the liquid pipe 140 may have a laminated structure of, for example, seven metal layers 361 through 367. The metal layers 361 through 367 are, for example, copper layers, which have good thermal conductivity, and are directly joined together by, for example, solid-state welding. The thickness of each of the metal layers 361 through 367 may be, for example, approximately 50 µm to approximately 200 µm. The metal layers 361 through 364 form the first flow path 101A, and the metal layers 364 through 367 faun the second flow path 101B. The porous body 150 is provided in the liquid pipe 140. The metal layers 361 through 367 are not limited to copper layers, and may be, for example, stainless steel layers, aluminum layers, or magnesium alloy layers.

Figure 19:
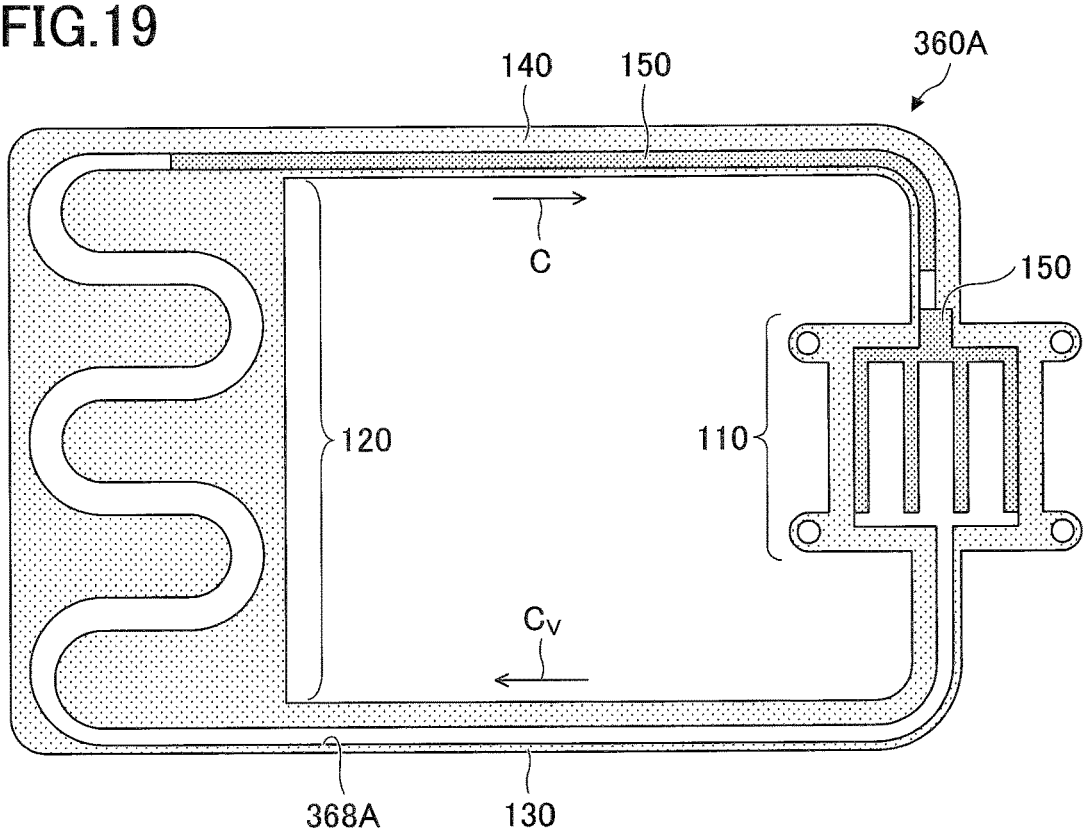
FIG. 19 is a plan view illustrating a configuration of a metal layer of the loop heat pipe according to the third embodiment.
Figure 20:
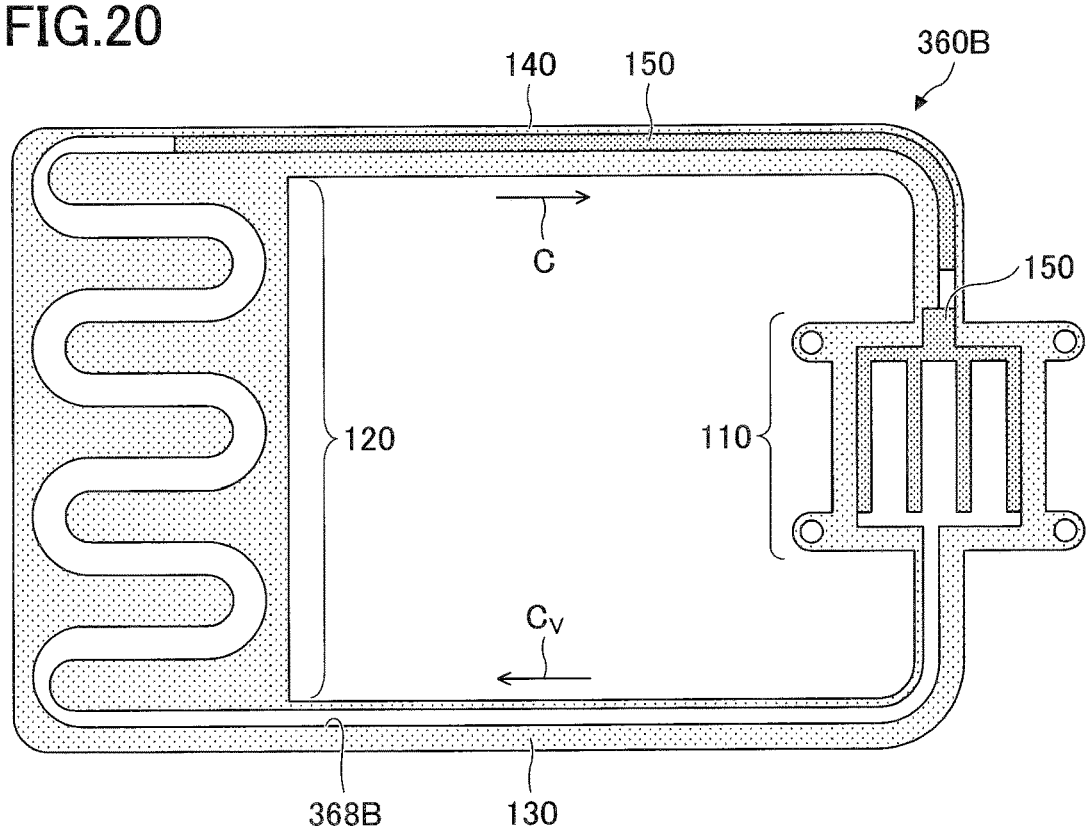
FIG. 20 is a plan view illustrating a configuration of a metal layer of the loop heat pipe according to the third embodiment.

Next, a configuration of the metal layers 361 through 367 is described, focusing on a configuration of the second metal layer 362, the third metal layer 363, the fifth metal layer 365, and the sixth metal layer 366. FIG. 19 is a plan view illustrating a configuration of the metal layers 362 and 363. FIG. 20 is a plan view illustrating a configuration of the metal layers 365 and 366. Hereinafter, the metal layers 362 and 363 may be collectively referred to as "metal layer 360A." Furthermore, the metal layers 365 and 366 may be collectively referred to as "metal layer 360B."

Referring to FIG. 19, an opening 368A extending along the movement direction of the working fluid C is formed in the metal layer 360A. Furthermore, the porous body 150 is provided in the opening 368A in the liquid pipe 140. The porous body 150 extends from the condenser 120 to the evaporator 110 along the liquid pipe 140. According to the third embodiment, the opening 368A of the metal layer 360A is provided on the outer side of the loop in the vapor pipe 130 and on the inner side of the loop in the liquid pipe 140.

Referring to FIG. 20, an opening 368B extending along the movement direction of the working fluid C is formed in the metal layer 360B. Furthermore, the porous body 150 is provided in the opening 368B in the liquid pipe 140. The porous body 150 extends from the condenser 120 to the evaporator 110 along the liquid pipe 140. According to the third embodiment, the opening 368B of the metal layer 360B is provided on the inner side of the loop in the vapor pipe 130 and on the outer side of the loop in the liquid pipe 140.

The outlines of the metal layers 361, 364 and 367 coincide with the outlines of the metal layers 360A and 360B in a plan view. The metal layers 361, 364 and 367, however, are solid metal layers in which neither the opening 368A nor the opening 368B is formed.

According to the third embodiment, the metal layers 361 through 364 form a single loop flow path (the first flow path 101A), and the metal layers 364 through 367 form a single loop flow path (the second flow path 101B).

Furthermore, referring to FIGS. 17 through 20, according to the third embodiment, the first flow path 101A and the second flow path 101B are provided at positions offset from each other in a plan view, in the vapor pipe 130 and the liquid pipe 140. For example, the first flow path 101A and the second flow path 101B may be diagonal to each other across the metal layer 364, which is an example of the divider, in a cross-sectional view as illustrated in FIG. 17 or 18. Referring to FIG. 17, the metal layer 364 includes an upper (first) surface 364a exposed to the first flow path 101A, and a lower (second) surface 364b exposed to the second flow path 101B.

Furthermore, referring to FIGS. 19 and 20, according to the third embodiment, while the openings 368A and 368B meander in the condenser 120, unlike in the first and second embodiments, the cycle of meandering differs between the openings 368A and 368B. Accordingly, the area of overlap of the first flow path 101A and the second flow path 101B in a plan view in the condenser 120 is smaller than in the first and second embodiments. The third embodiment, however, is not limited to this configuration, and the openings 368A and 368B may meander in the same cycle in the condenser 120.

Thus, in the third embodiment, the overlap between the first flow path 101A and the second flow path 101B in a plan view is smaller than in the first and second embodiments. As the internal pressure of the flow path increases, typically, the vapor pipe 130 and the condenser 120 through which the vapor Cv flows may expand. According to the third embodiment, however, the metal layers 364 through 367 prevent the deformation of the first flow path 101A, and the metal layers 361 through 364 prevent the deformation of the second flow path 101B. Accordingly, even when the internal pressure of the first flow path 101A or the second flow path 101B increases, it is possible to prevent its expansion.

Furthermore, the working fluid C may be caused to differ in the range of operating temperatures between the first flow path 101A and the second flow path 101B. Therefore, according to the third embodiment as well, it is possible to widen the range of operating temperatures and prevent a decrease in the heat transport performance due to an increase in the ambient temperature, the same as in the first embodiment.

[d] Fourth Embodiment

Next, a description is given of a fourth embodiment, which relates to a loop heat pipe. The fourth embodiment is different from the first embodiment in the arrangement of a vapor pipe and a liquid pipe.

Figure 21:
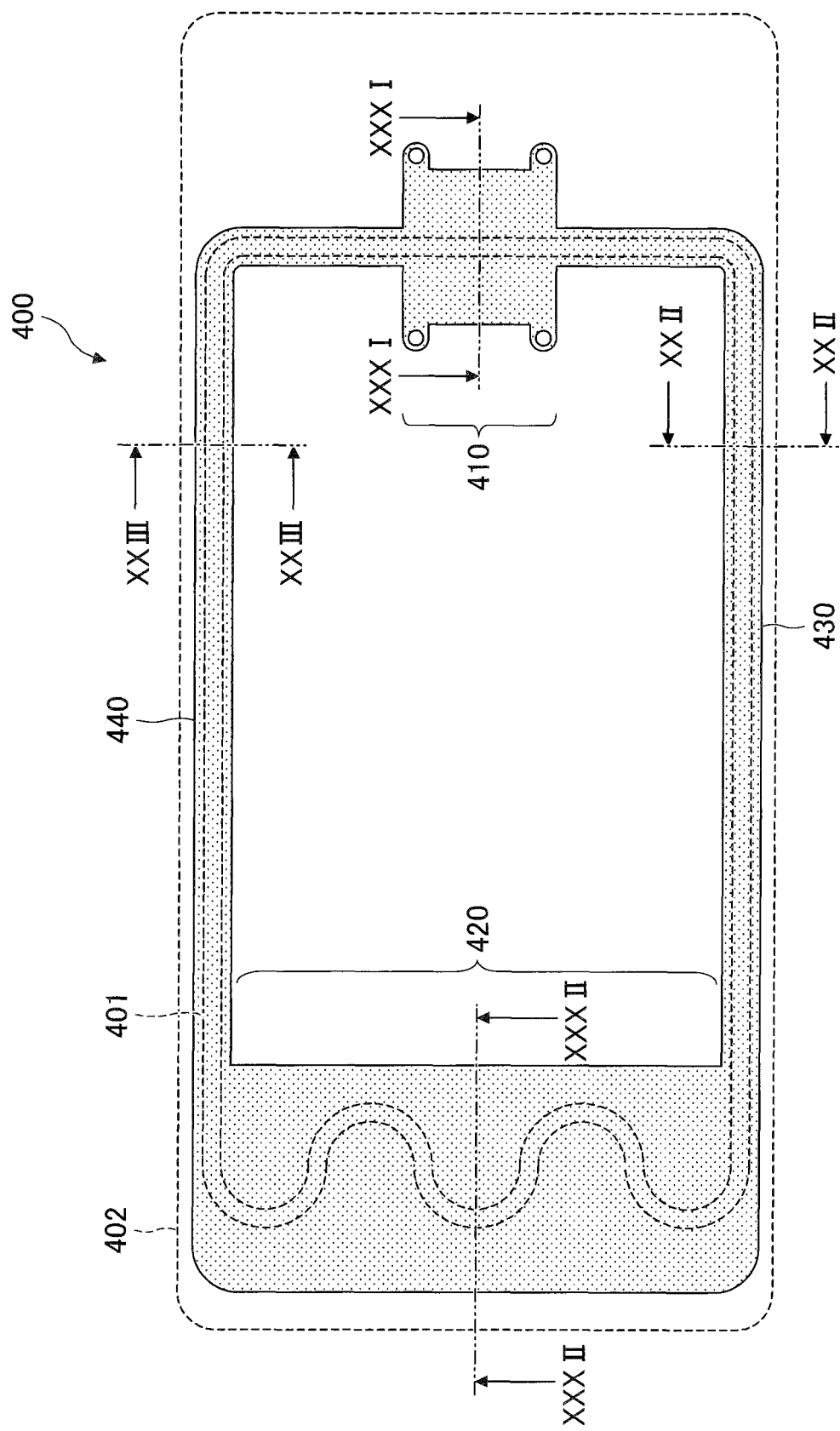
FIG. 21 is a schematic plan view of a loop heat pipe according to a fourth embodiment.

FIG. 21 is a schematic plan view of a loop heat pipe 400 according to the fourth embodiment.

Referring to FIG. 21, the loop heat pipe 400 includes an evaporator 410, a condenser 420, a first transport pipe 430, and a second transport pipe 440. The loop heat pipe 400 may be accommodated in, for example, a mobile electronic device 402 such as a smartphone or a tablet terminal.

According to the loop heat pipe 400, the evaporator 410 is configured to vaporize the working fluid C to generate the vapor Cv. The condenser 420 is configured to condense the vapor Cv of the working fluid C. The evaporator 410 and the condenser 420 are connected by the first transport pipe 430 and the second transport pipe 440. The first transport pipe 430 and the second transport pipe 440 form a loop flow path 401 in which the working fluid C or the vapor Cv flows.

The evaporator 410, the condenser 420, the first transport pipe 430, and the second transport pipe 440 may have a laminated structure of multiple metal layers, for example. The metal layers are, for example, copper layers, which have good thermal conductivity, and are directly joined together by, for example, solid-state welding. The thickness of each metal layer may be, for example, approximately 50 µm to approximately 200 µm.

The metal layers are not limited to copper layers, and may be, for example, stainless steel layers, aluminum layers, or magnesium alloy layers.

Figure 22:
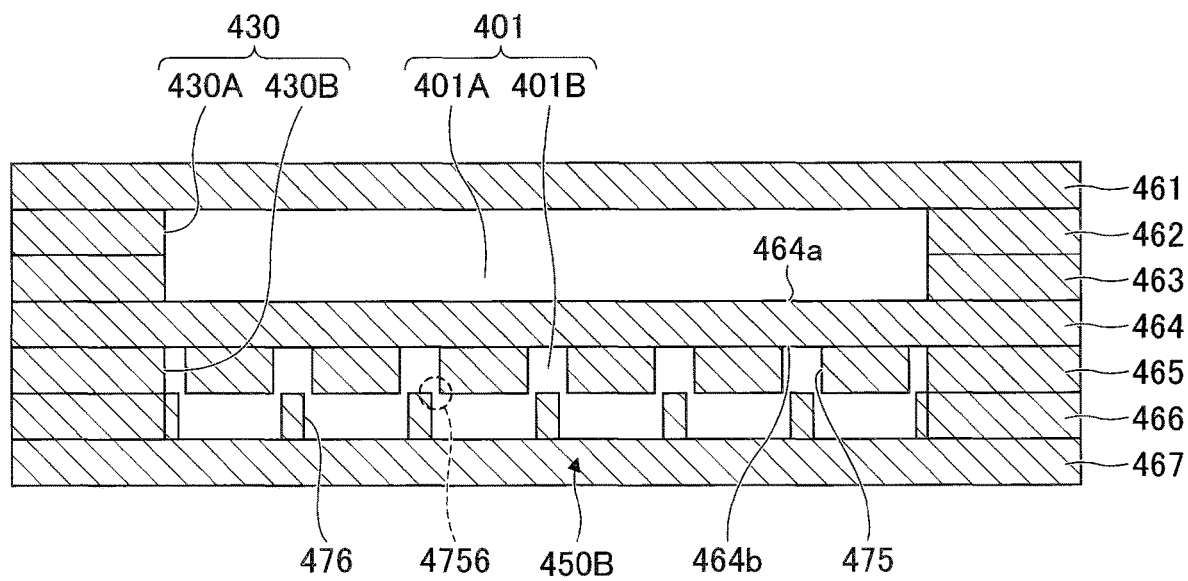
FIG. 22 is a cross-sectional view illustrating a configuration of a first transport pipe of the loop heat pipe according to the fourth embodiment.
Figure 23:
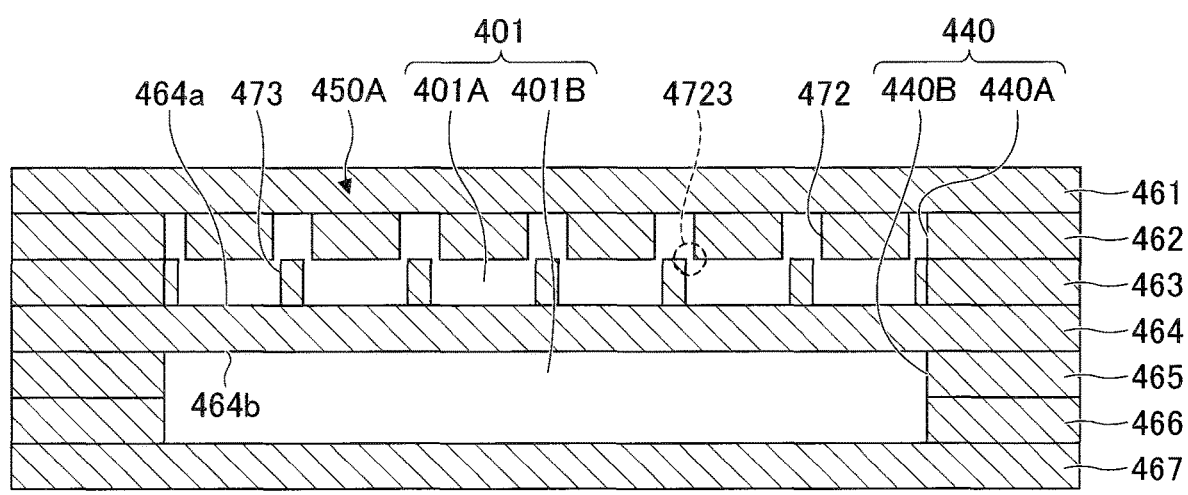
FIG. 23 is a cross-sectional view illustrating a configuration of a second transport pipe of the loop heat pipe according to the fourth embodiment.

Next, a configuration of the first transport pipe 430 and a configuration of the second transport pipe 440 are described. FIG. 22 is a cross-sectional view taken along the line XXII-XXII in FIG. 21, illustrating a configuration of the first transport pipe 430. FIG. 23 is a cross-sectional view taken along the line XXIII-XXIII in FIG. 21, illustrating a configuration of the second transport pipe 440.

The first transport pipe 430 and the second transport pipe 440 may have a laminated structure of, for example, seven metal layers 461 through 467. The metal layers 461 through 467 are, for example, copper layers, which have good thermal conductivity, and are directly joined together by, for example, solid-state welding. The thickness of each of the metal layers 461 through 467 may be, for example, approximately 50 μm to approximately 200 μm. The metal layers 461 through 464 form a first flow path 401A, and the metal layers 464 through 467 form a second flow path 401B. In the first flow path 401A, a porous body 450 is provided in the second transport pipe 440 as illustrated in FIG. 23. In the second flow path 401B, the porous body 450 is provided in the first transport pipe 430 as illustrated in FIG. 22. Referring to FIGS. 22 and 23, the porous body 450 has the same configuration as the porous body 150, for example. Referring to FIG. 22, for example, the porous body 450 in the first transport pipe 430 includes through holes 475 formed in the metal layer 465, through holes 476 formed in the metal layer 466, and pores 4756 formed by the through holes 475 and 476 communicating with each other. Referring to FIG. 23, for example, the porous body 450 in the second transport pipe 440 includes through holes 472 formed in the metal layer 462, through holes 473 formed in the metal layer 463, and pores 4723 formed by the through holes 472 and 473 communicating with each other. The metal layers 461 through 467 are not limited to copper layers, and may be, for example, stainless steel layers, aluminum layers, or magnesium alloy layers.

Figure 24:
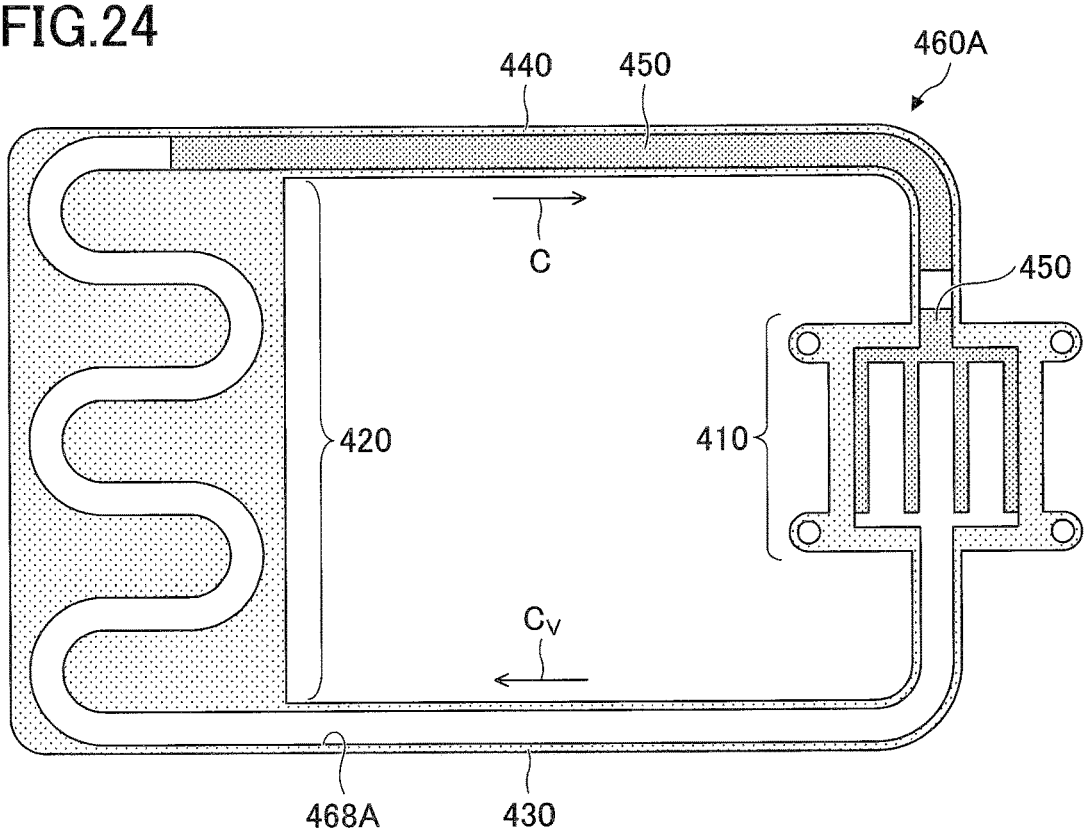
FIG. 24 is a plan view illustrating a configuration of a metal layer of the loop heat pipe according to the fourth embodiment.
Figure 25:
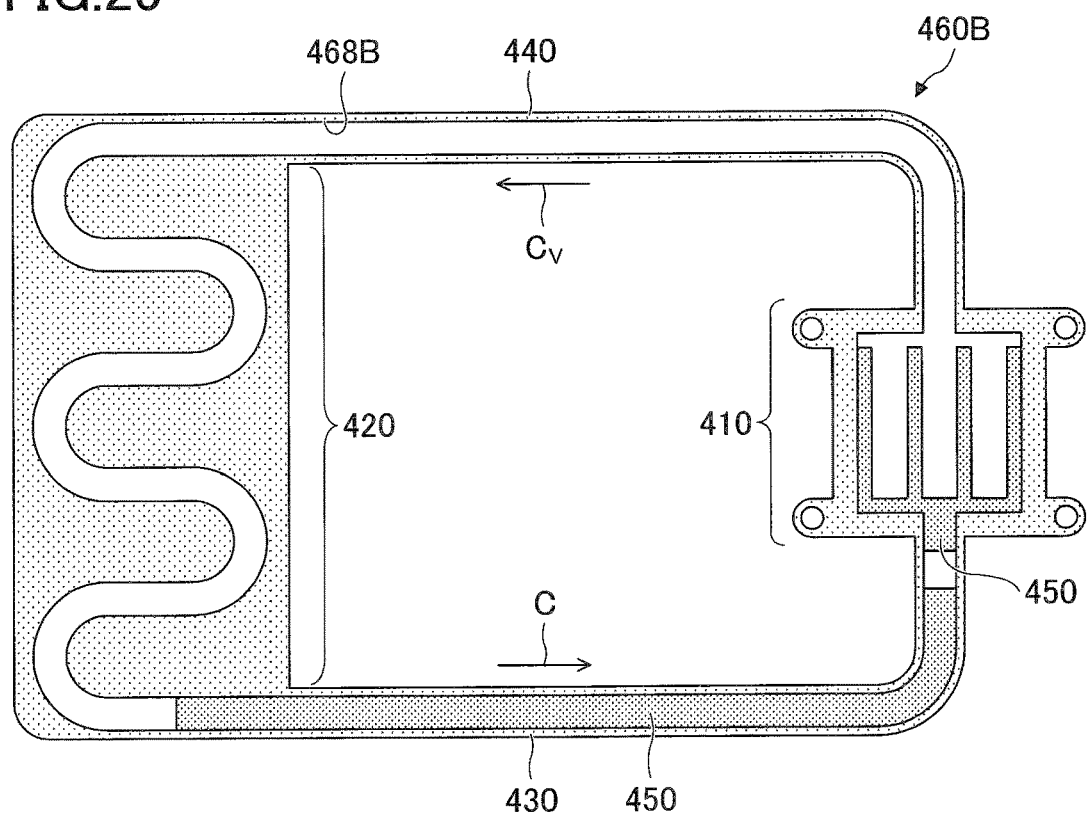
FIG. 25 is a plan view illustrating a configuration of a metal layer of the loop heat pipe according to the fourth embodiment.

Next, a configuration of the metal layers 461 through 467 is described. FIG. 24 is a plan view illustrating a configuration of the metal layers 462 and 463. FIG. 25 is a plan view illustrating a configuration of the metal layers 465 and 466. Hereinafter, the second metal layer 462 and the third metal layer 463 may be collectively referred to as "metal layer 460A." Furthermore, the fifth metal layer 465 and the sixth metal layer 466 may be collectively referred to as "metal layer 460B."

Referring to FIG. 24, an opening 468A extending along the movement direction of the working fluid C is formed in the metal layer 460A. Furthermore, the porous body 450 is provided in the opening 468A in the second transport pipe 440. The porous body 450 extends from the condenser 420 to the evaporator 410 along the second transport pipe 440. The porous body 450 is also provided in the evaporator 410.

Referring to FIG. 25, an opening 468B extending along the movement direction of the working fluid C is formed in the metal layer 460B. Furthermore, the porous body 450 is provided in the opening 468B in the first transport pipe 430. The porous body 450 extends from the condenser 420 to the evaporator 410 along the first transport pipe 430. The porous body 450 is also provided in the evaporator 410.

The outlines of the metal layers 461, 464 and 467 coincide with the outlines of the metal layers 460A and 460B in a plan view. The metal layers 461, 464 and 467, however, are solid metal layers in which neither the opening 468A nor the opening 468B is formed.

Figure 31:
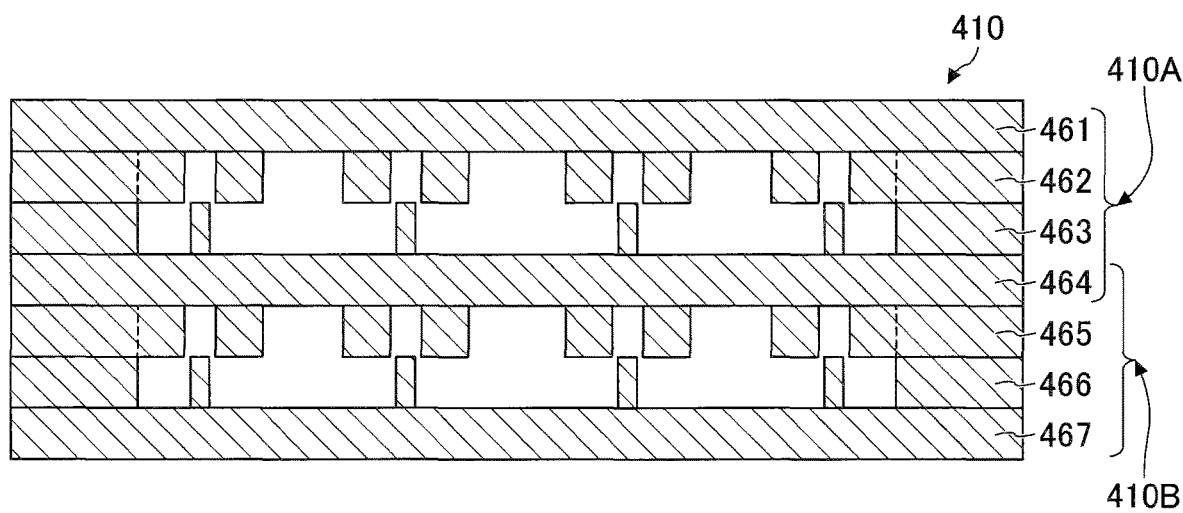
FIG. 31 is a cross-sectional view illustrating a configuration of an evaporator according to the fourth embodiment.
Figure 32:
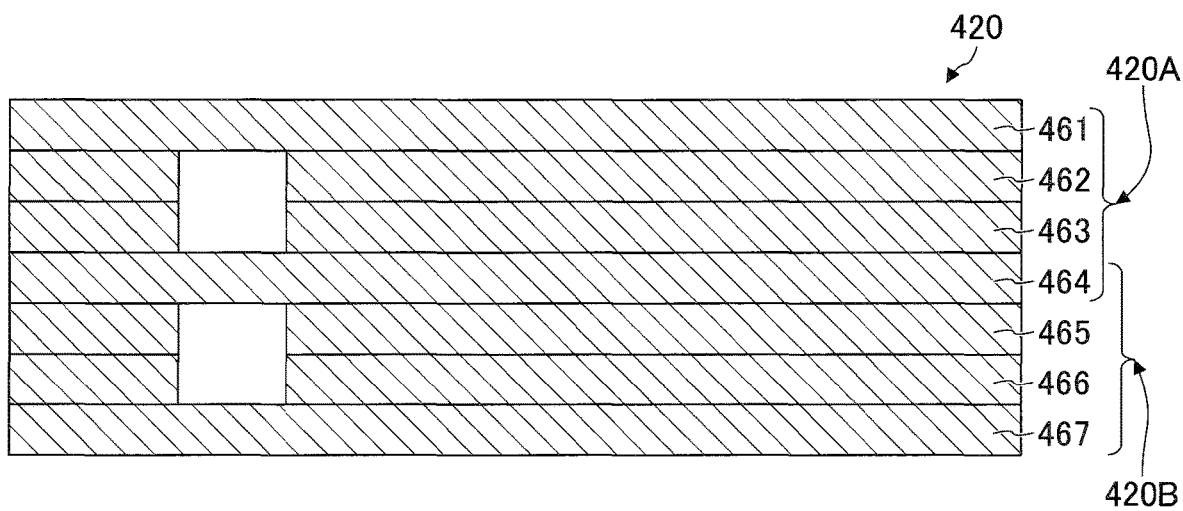
FIG. 32 is a cross-sectional view illustrating a configuration of a condenser according to the fourth embodiment.

Thus, according to the loop heat pipe 400, the metal layers 461 through 464 form a single loop flow path (the first flow path 401A), and the metal layers 464 through 467 form a single loop flow path (the second flow path 401B). That is, according to the loop heat pipe 400, the evaporator 410, the condenser 420, the first transport pipe 430, and the second transport pipe 440 are divided into two parts by the metal layer 464 in the thickness direction of the loop heat pipe 400. That is, as illustrated in FIGS. 22, 23, 31 and 32, the evaporator 410 is divided into a first evaporator 410A and a second evaporator 410B, the condenser 420 is divided into a first condenser 420A and a second condenser 420B, the first transport pipe 430 is divided into a first vapor pipe 430A and a second liquid pipe 430B, and the second transport pipe 440 is divided into a first liquid pipe 440A and a second vapor pipe 440B. Furthermore, the porous body 450 includes a first porous body 450A provided in the second transport pipe 440 in the first flow path 401A and a second porous body 450B provided in the first transport pipe 430 in the second flow path 401B. In the first flow path 401A, the first transport pipe 430 operates as a vapor pipe and the second transport pipe 440 operates as a liquid pipe. In the second flow path 401B, the first transport pipe 430 operates as a liquid pipe and the second transport pipe 440 operates as a vapor pipe. Accordingly, the working fluid C flows in opposite directions in the first flow path 401A and the second flow path 401B. FIG. 31 is a cross-sectional view taken along the line XXXI-XXXI in FIG. 21, illustrating a configuration of the evaporator 410 according to the fourth embodiment. FIG. 32 is a cross-sectional view taken along the line XXXII-XXXII in FIG. 21, illustrating a configuration of the condenser 420 according to the fourth embodiment. The metal layer 464 is an example of the divider. Referring to FIGS. 22 and 23, the metal layer 464 includes an upper (first) surface 464a exposed to the first flow path 401A, and a lower (second) surface 464b exposed to the second flow path 401B.

In other words, the metal layers 461 through 464 fault the first evaporator 410A, the first condenser 420A, the first vapor pipe 430A, the first liquid pipe 440A, and the first porous body 450A, and the metal layers 464 through 467 form the second evaporator 410B, the second condenser 420B, the second vapor pipe 440B, the second liquid pipe 430B, and the second porous body 450B. In the thickness direction of the plate-shaped loop heat pipe 400, the first evaporator 410A and the second evaporator 410B are positioned one over the other, the first condenser 420A and the second condenser 420B are positioned one over the other, the first liquid pipe 440A and the second vapor pipe 440B are positioned one over the other, and the first vapor pipe 430A and the second liquid pipe 430B are positioned one over the other.

The working fluid C may be caused to differ in the range of operating temperatures between the first flow path 401A and the second flow path 401B.

Therefore, according to the fourth embodiment as well, it is possible to widen the range of operating temperatures and prevent a decrease in the heat transport performance due to an increase in the ambient temperature, the same as in the first embodiment.

Furthermore, the metal layers 464 through 467 prevent the deformation of the first flow path 401A, and the metal layers 461 through 464 prevent the deformation of the second flow path 401B. Accordingly, even when the internal pressure of the first flow path 401A or the second flow path 401B increases, it is possible to prevent its expansion the same as in the third embodiment.

The third and fourth embodiments are applicable to the second embodiment. That is, the third and fourth embodiments are applicable to a loop heat pipe in which a porous body is formed using bottomed holes.

The number of metal layers of a loop heat pipe is not limited to those of the above-described embodiments. Furthermore, two or more dividers may be provided to divide a flow path into three or more flow paths.

The size and interval of through holes or bottomed holes may be suitably selected according to the amount of heat transfer and the heat transfer distance required of a loop heat pipe, the height of a liquid pipe, etc.

The planar shape of through holes or bottomed holes is not limited to a rectangle, but may be any of other planar shapes such as a circle, an ellipse, and other polygons. Furthermore, the through holes or bottomed holes may differ in size between metal layers. Furthermore, the inner walls of through holes or bottomed holes in a cross-sectional view, which are illustrated as being shaped perpendicularly to the bottom surface according to the above-described embodiments, are not limited to this, and may be semi-circularly curved, tapered, or inversely tapered.

Furthermore, a porous body may also be provided in a vapor pipe. A porous body provided in a liquid pipe and a porous body provided in an evaporator may be either equal to or different from each other in the planar shape and cross-sectional shape of through holes or bottomed holes and the arrangement of through holes or bottomed holes.

According to an aspect of the present invention, a loop heat pipe that can control a decrease in the heat transport performance due to an increase in the ambient temperature is provided.

According to an aspect of the present invention it is possible to control a decrease in the heat transport performance due to an increase in the ambient temperature.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject-matter described herein may be set out non-exhaustively in the following numbered clauses:

1. A method of manufacturing a loop heat pipe, including:
    forming a first flow path, and a second flow path over the first flow path,
    wherein the forming includes providing a divider separating the first flow path and the second flow path, and
    wherein the first flow path includes a first evaporator configured to vaporize a working fluid, a first condenser configured to condense the working fluid, a first transport pipe connecting the first evaporator and the first condenser, and a second transport pipe connecting the first evaporator and the first condenser, the second transport pipe forming a first loop flow path with the first transport pipe, and the second flow path includes a second evaporator configured to vaporize the working fluid, a second condenser configured to condense the working fluid, a third transport pipe connecting the second evaporator and the second condenser, and a fourth transport pipe connecting the second evaporator and the second condenser, the fourth transport pipe forming a second loop flow path with the third transport pipe.

2. The method of clause 1, further including:
    sealing a first working fluid into the first flow path; and
    sealing a second working fluid into the second flow path, the second working fluid being different in a range of operating temperatures from the first working fluid.

What is claimed is:

1. A loop heat pipe comprising:
    a first flow path;
    a second flow path over the first flow path; and
    a divider provided between an entirety of the first flow path and an entirety of the second flow path,
    wherein the first flow path includes
        a first evaporator configured to vaporize a working fluid;
        a first condenser configured to condense the working fluid;
        a first transport pipe connecting the first evaporator and the first condenser; and
        a second transport pipe connecting the first evaporator and the first condenser, the second transport pipe forming a first loop flow path with the first transport pipe, and
    wherein the second flow path includes
        a second evaporator configured to vaporize the working fluid;
        a second condenser configured to condense the working fluid;
        a third transport pipe connecting the second evaporator and the second condenser; and
        a fourth transport pipe connecting the second evaporator and the second condenser, the fourth transport pipe forming a second loop flow path with the third transport pipe.

2. The loop heat pipe as claimed in claim 1, further comprising:
    a first working fluid sealed into the first flow path; and
    a second working fluid sealed into the second flow path, the second working fluid being different in a range of operating temperatures from the first working fluid.

3. The loop heat pipe as claimed in claim 1, wherein the divider includes a first surface exposed to the first flow path and a second surface exposed to the second flow path, the second surface being on an opposite side of the divider from the first surface.

4. The loop heat pipe as claimed in claim 1, wherein
    each of the first flow path and the second flow path has a laminated structure of a plurality of metal layers, and
    the divider is a metal layer among the plurality of metal layers.

5. The loop heat pipe as claimed in claim 1, further comprising:
    a porous body provided in the first transport pipe or the second transport pipe and configured to guide the working fluid condensed by the first condenser to the first evaporator in the first flow path, and provided in the third transport pipe or the fourth transport pipe and configured to guide the working fluid condensed by the second condenser to the second evaporator in the second flow path.

6. The loop heat pipe as claimed in claim 1, further comprising:
    a porous body provided in the first transport pipe or the second transport pipe and configured to guide the working fluid condensed by the first condenser to the first evaporator in the first flow path, and provided in the third transport pipe or the fourth transport pipe and configured to guide the working fluid condensed by the second condenser to the second evaporator in the second flow path, wherein each of the first flow path and the second flow path has a laminated structure of a plurality of metal layers, and the divider is a metal layer among the plurality of metal layers.

7. The loop heat pipe as claimed in claim 6, wherein
the porous body is formed of one or more metal layers among the plurality of metal layers, each of the one or more metal layers includes a first surface and a second surface on an opposite side of said each of the one or more metal layers from the first surface, and a first hole having a first bottom and recessed from the first surface, a second hole having a second bottom and recessed from the second surface, and a pore between the first bottom and the second bottom, through which the first hole and the second hole communicate with each other, are formed in said each of the one or more metal layers.

8. The loop heat pipe as claimed in claim 6, wherein
the porous body is formed of two or more metal layers among the plurality of metal layers, a plurality of through holes are formed in each of the two or more metal layers to pierce through said each of the two or more metal layers in a thickness direction thereof, the plurality of through holes include first through holes and second through holes formed in a first metal layer and a second metal layer, respectively, the first metal layer and the second metal layer being adjacent to each other among the two or more metal layers, and the first through holes and the second through holes communicate with each other through pores, the pores being formed where the first through holes and the second through holes overlap each other in a plan view.

9. The loop heat pipe as claimed in claim 1, wherein the first flow path and the second flow path include respective regions that are offset from each other in a plan view.

10. The loop heat pipe as claimed in claim 9, wherein
the respective regions are positioned in the first and third transport pipes, the second and fourth transport pipes, the first and second condensers, or any combination thereof.

11. A loop heat pipe comprising:
a first laminated structure of metal layers including a first flow path through which a first working fluid flows;

a second laminated structure of metal layers over the first laminated structure, and including a second flow path through which a second working fluid flows; and a metal layer provided between an entirety of the first laminated structure and an entirety of the second laminated structure to separate the first flow path and the second flow path, wherein the first laminated structure includes
a first evaporator configured to vaporize the first working fluid;

a first condenser configured to condense the first working fluid;

a first transport pipe connecting the first evaporator and the first condenser; and a second transport pipe connecting the first evaporator and the first condenser, the second transport pipe forming a first loop flow path with the first transport pipe, the first evaporator, the first condenser, the first transport pipe, and the second transport pipe forming the first flow path, and wherein the second laminated structure includes
a second evaporator configured to vaporize the second working fluid;

a second condenser configured to condense the second working fluid;

a third transport pipe connecting the second evaporator and the second condenser; and a fourth transport pipe connecting the second evaporator and the second condenser, the fourth transport pipe forming a second loop flow path with the third transport pipe, the second evaporator, the second condenser, the third transport pipe, and the fourth transport pipe forming the second flow path.

* * * * *